United States Patent [19]

Kitajima et al.

[11] Patent Number: 5,549,798
[45] Date of Patent: Aug. 27, 1996

[54] WET PROCESSING APPARATUS HAVING INDIVIDUAL REACTIVATING FEEDBACK PATHS FOR ANODE AND CATHODE WATER

[75] Inventors: Hiroshi Kitajima; Hidemitsu Aoki; Haruto Hamano; Makoto Morita; Yoshimi Shiramizu; Masaharu Nakamori; Kaori Watanabe; Hirofumi Seo; Yuji Shimizu; Makoto Iuchi; Yasushi Sasaki; Nahomi Ohta, all of Tokyo, Japan

[73] Assignee: NEC Corporation, Tokyo, Japan

[21] Appl. No.: 409,306

[22] Filed: Mar. 24, 1995

[30] Foreign Application Priority Data

Mar. 25, 1994 [JP] Japan ................................. 6-056108
Mar. 25, 1994 [JP] Japan ................................. 6-056110

[51] Int. Cl.$^6$ .......................... C25F 7/02; C25B 15/02; C25B 15/08
[52] U.S. Cl. .................. 204/222; 204/237; 204/238; 204/239; 204/262; 204/265; 204/275; 204/276; 204/277; 204/273
[58] Field of Search ..................... 204/237–239, 204/262, 263–266, 273, 275–278, 274, 222

[56] References Cited

U.S. PATENT DOCUMENTS

| | | | |
|---|---|---|---|
| 4,834,850 | 5/1989 | de Nora et al. | 204/237 X |
| 4,891,103 | 1/1990 | Zorinsky et al. | 204/237 X |
| 5,173,161 | 12/1992 | Gramm | 204/237 X |
| 5,411,652 | 5/1995 | Smith et al. | 204/237 X |
| 5,431,801 | 7/1995 | Nishimura et al. | 204/237 X |
| 5,458,755 | 10/1995 | Fujiyama et al. | 204/237 X |

FOREIGN PATENT DOCUMENTS 6-260480  9/1994  Japan .

*Primary Examiner*—Donald R. Valentine
*Attorney, Agent, or Firm*—Popham, Haik, Schnobrich & Kaufman, Ltd.

[57] ABSTRACT

In a wet processing apparatus, an electrolytic cell, a first storing cell for storing anode active water of the electrolytic cell, a first processing cell for processing a target with the anode active water of the first storing cell, a second storing cell for storing cathode active water of the electrolytic cell, and a second processing cell for processing a target with the cathode active water of the second storing cell are provided. Also, a first reactivating feedback path is provided between the first processing cell and an anode region of the electrolytic cell, and a second reactivating feedback path is provided between the second processing cell and a cathode region of the electrolytic cell.

78 Claims, 22 Drawing Sheets

5,549,798

WET PROCESSING APPARATUS HAVING INDIVIDUAL REACTIVATING FEEDBACK PATHS FOR ANODE AND CATHODE WATER

BACKGROUND OF THE INVENTION

1. Field of the Invention

The present invention relates to a wet processing apparatus used in the manufacture of semiconductor devices.

2. Description of the Related Art

In the manufacture of semiconductor devices, wet processing steps are so essential that the manufacturing yield of semiconductor devices is dependent thereupon. For example, one wet processing step cleans surfaces of wafers to remove contamination therefrom. Other wet processing steps remove photoresist in a photolithography step, etch a semiconductor region in a semiconductor region forming step, etch an insulating layer in an insulating layer forming step, and etch a metal layer in a metal layer forming step. These wet processing steps use a large amount of chemicals such as organic solvent, strong acid and strong alkali.

The wet processing steps are mainly divided into three steps: a cleaning step, an etching step and a rinsing step. For example, in a cleaning and rinsing step, contamination, organic or inorganic particles, residual resist and ionic residue are removed from a surface of a wafer without affecting the wafer. In this case, chemicals using a mixture of 27 percent $NH_4OH$, 30 percent $H_2O_2$ and water having a ratio of 1:1:6 are used. Also, in an etching step, the wafer is etched, or a natural oxide layer or an organic layer on the wafer is etched.

In the above-mentioned wet processing steps, large amounts of discarded chemicals are to be processed, and therefore, large scale equipment and running costs are required. That is, used pure water is reactivated by a closed system to recover pure water. Used chemicals are also reactivated until they are used up, and they are finally decomposed and neutralized, and then discarded.

In view of the foregoing, in order to drastically reduce the amount of chemicals used, a wet processing apparatus has been proposed by Japanese Patent Application No. HEI5-105991 filed on Apr. 9, 1993. This wet processing apparatus includes an electrolytic cell for generating anode active water and cathode active water, a first processing cell for processing a target with the anode active water, a second processing cell for processing a target with the cathode active water, and a used water cell for storing the used water of the first and second processing cells. Also, a reactivating feedback path formed by a water treatment unit and an ion exchange unit is provided between the used water cell and the electrolytic cell, so that the used water is reactivated and fed back to the electrolytic cell. This will be explained later in detail.

In the above-described proposed wet processing apparatus, however, since the used anode water and the used cathode water are merged in the used water cell, $H^+$ions of the anode water and $OH-$ ions of the cathode water are neutralized, so that more supporting electrolyte or the like has to be added to the merged water before the electrolytic cell. This is disadvantageous in that it prevents a reduction of chemicals.

Also, in the above-described proposed wet processing apparatus, since the electrolytic water of the electrolytic cell is directly supplied to the processing cells, the electrolytic cell has to be enlarged. Also, the electrolyte is easily deteriorated.

Further, in the above-described proposed wet processing apparatus, the deterioration of electrolyte cannot be completely monitored.

SUMMARY OF THE INVENTION

It is an object of the present invention to reduce chemicals used in a wet processing apparatus.

Another object is to reduce the size of the electrolytic cell and suppress the deterioration of electrolyte in a wet processing apparatus.

A further object is to completely monitor the deterioration of electrolyte in a wet processing apparatus.

According to the present invention, in a wet processing apparatus, an electrolytic cell, a first storing cell for storing anode active water of the electrolytic cell, a first processing cell for processing a target with the anode active water of the first storing cell, a second storing cell for storing cathode active water of the electrolytic cell, and a second processing cell for processing a target with the cathode active water of the second storing cell are provided. Also, a first reactivating feedback path is provided between the first processing cell and an anode region of the electrolytic cell, and a second reactivating feedback path is provided between the second processing cell and a cathode region of the electrolytic cell.

Thus, since one reactivating feedback path is provided for each of the anode water and the cathode water, the amount of chemicals is reduced. Also, since one storing cell is provided for each of the anode active water and the cathode active water, the electrolyte cell is reduced in size, and the deterioration of electrolyte is suppressed by each of the storing cells.

Further, a reduction-oxidation (redox) sensor is provided within each of the storing cells, thus completely monitoring the deterioration of electrolyte.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, a proposed wet processing apparatus will be explained with reference to FIG. 1 (see: Japanese Patent Application No. HEI5-105991).

Figure 1:
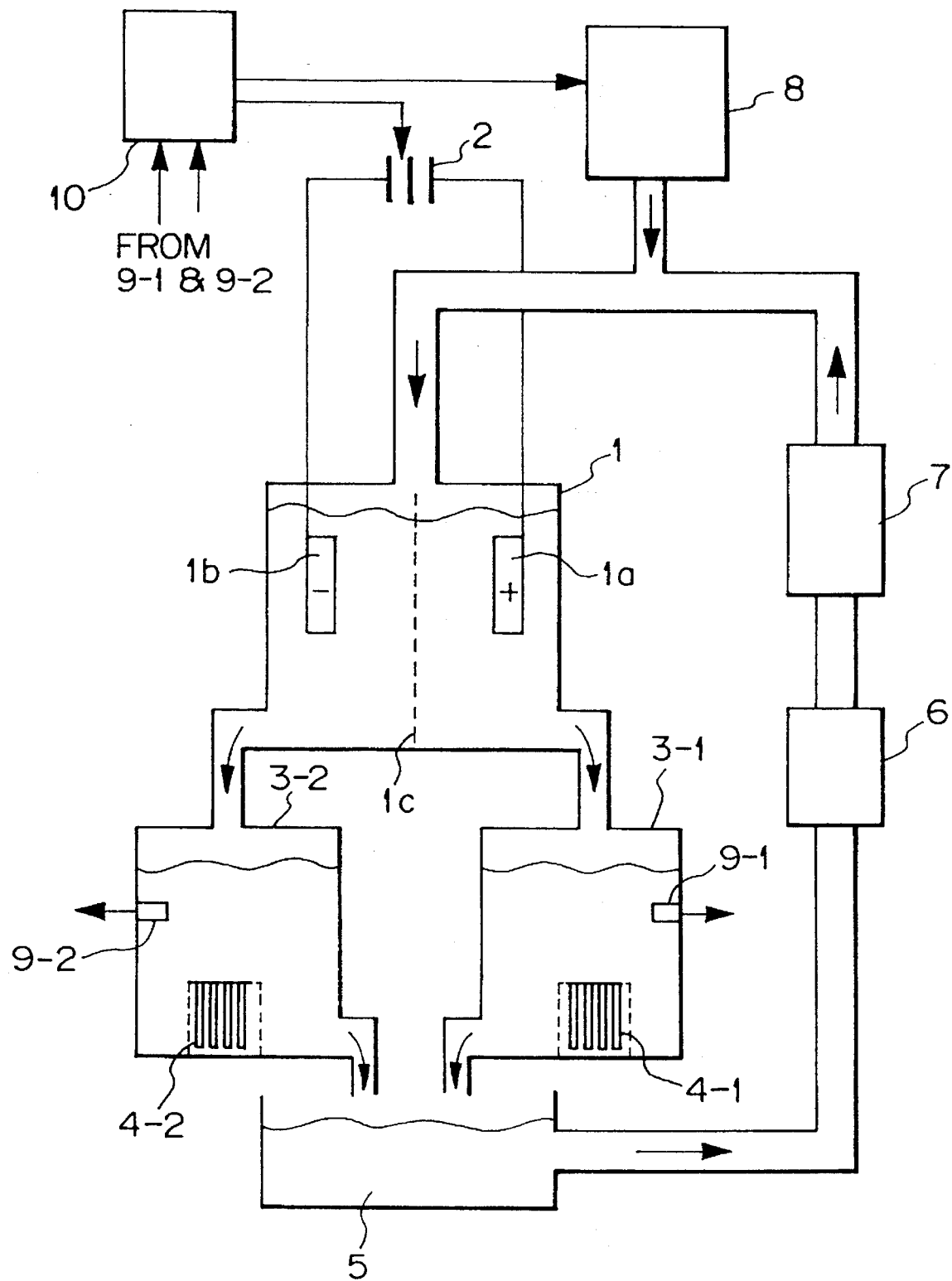
FIG. 1 is a diagram illustrating a proposed wet processing apparatus.

In FIG. 1, reference numeral 1 designates an electrolytic cell having an anode electrode 1a and a cathode electrode 1b and partitioned by a porous film 1c made of polycrystalline silicon. When a direct current is supplied from a DC power supply unit 2 to the anode electrode 1a and the cathode electrode 1b, anode active water (acid water, $H^+$ ion water) is generated in the vicinity of the anode electrode 1a, and cathode active water (alkali water, $OH^-$ ion water) is generated in the vicinity of the cathode electrode 1b. The anode active water is supplied from the electrolytic cell 1 to a processing cell 3-1 which processes a target (such as a wafer) 4-1 with the anode active water. On the other hand, the cathode active water is supplied from the electrolytic cell 1 to a processing cell 3-2 which processes a target (such as a wafer) 4-2 with the cathode active water. The anode water used in the processing cell 3-1 and the cathode water used in the processing cell 3-2 are merged in a used water cell 5. A reactivating feedback path including a water treatment unit 6 for removing particles and an ion exchange unit 6 is provided between the used water storing cell 5 and the electrolytic cell 1. As a result, supernatant liquid of the water stored in the used water storing cell 5 is regenerated by the reactivating feedback path into pure water, and the pure water is again supplied to the electrolytic cell 1.

In order to improve the efficiency of electrolysis, the resistance of the pure water supplied to the electrolytic cell 1 is reduced by adding supporting electrolyte thereto. This supporting electrolyte is supplied from a supporting electrolyte supplying unit 8.

Provided within the processing cells 3-1 and 3-2 are pH sensors 9-1 and 9-2 for detecting the pH of the anode water and pH of the cathode water, respectively. The output signals of the pH sensors 9-1 and 9-2 are supplied to a control circuit (such as a microcomputer) 10. The control circuit 10 controls the amount of supplied supporting electrolyte and the voltage of the DC power supply unit 2, so that the pH valve of the anode water is brought close to a desired valve and the pH valve of the cathode water is also brought close to a desired valve.

In the wet processing apparatus of FIG. 1, however, since the anode water used in the processing cell 3-1 and the cathode water used in the processing cell 3-2 are merged and neutralized in the used water storing cell 5, chemicals included in the water are salvaged by the ion exchange unit 7. As a result, the resistance of pure water introduced into the electrolytic cell 1 becomes high. Therefore, in order to reduce the resistance of pure water, the control circuit 10 increases the amount of supporting electrolyte supplied from the supporting electrolyte supplying unit 8. This is disadvantageous in that it prevents a reduction of chemical usage.

Also, in the wet processing apparatus of FIG. 1, since the electrolytic water is directly supplied to the processing cells 3-1 and 3-2, the electrolytic cell 1 has to be enlarged. Also, the electrolyte (water) is easily deteriorated, since no measure is taken to avoid the deterioration of the electrolyte.

Figure 2:
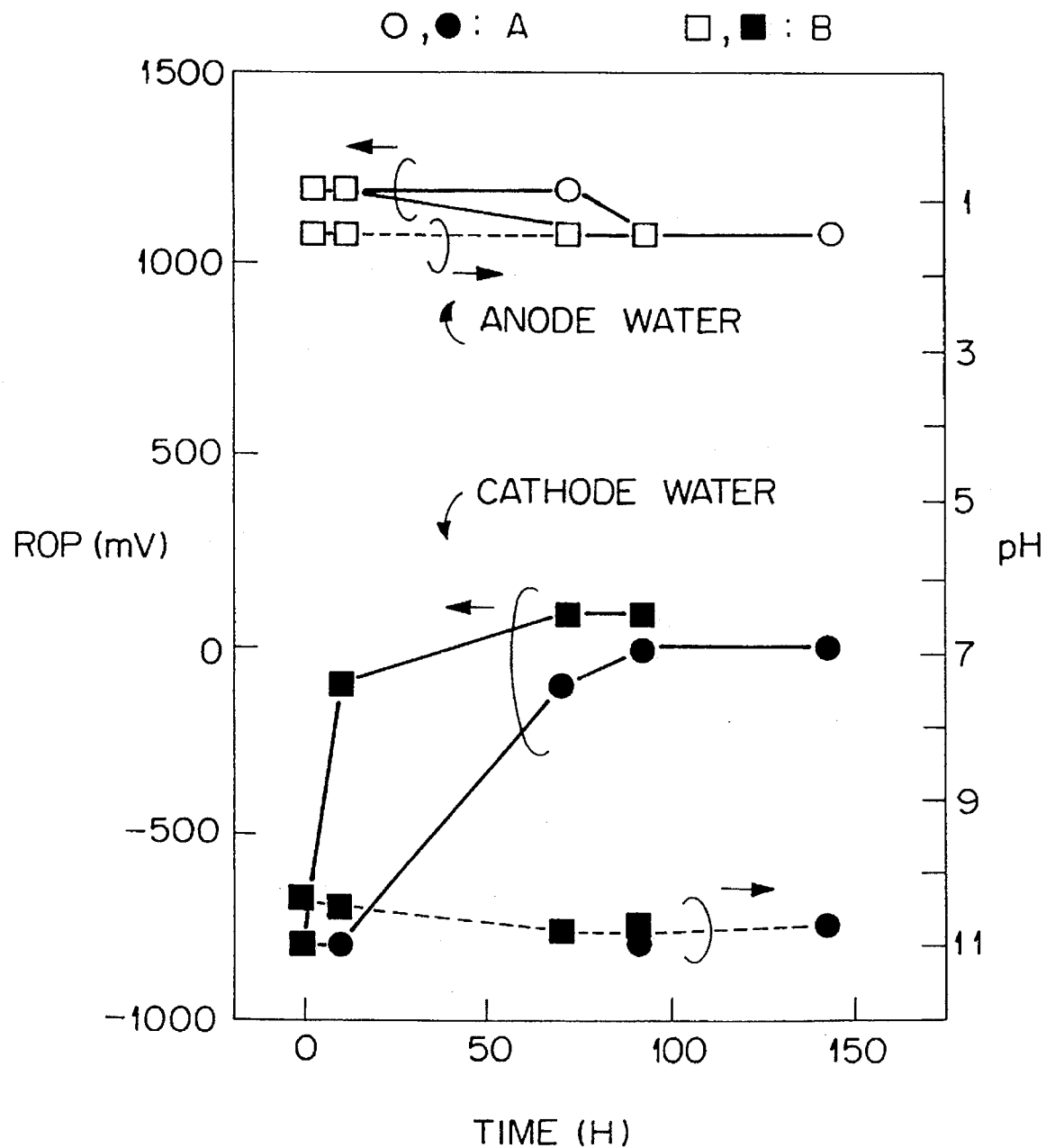
FIG. 2 is a graph showing the deterioration characteristics of electrolyte.

Further, in the wet processing apparatus of FIG. 1, the electrolyte supplied to the processing cells 3-1 and 3-2 has a low reproducibility and a low reliability. That is, the inventors have found that the deterioration of a pH valve is independent of the deterioration of a redox potential. For example, as shown in FIG. 2, if cathode active water is put in a polyethylene box, the pH valve is unchanged approximately at 10.5, while the redox potential ROD is changed from −600 mV to about 0 mV in 10 hours. Similarly, if anode active water is put in a polyethylene box, the pH valve is unchanged approximately at 1.5, while the redox potential ROD is changed from 1200 mV to about 1000 mV in 70 hours. This deterioration of the redox potential without the deterioration of the pH value may affect the manufacturing yield of semiconductor devices. For example, in order to remove metal contamination from wafers, the wafers should be immersed in active water having a low pH value and a high redox potential. Also, in order to etch silicon or silicon oxide on wafers, or in order to remove particles from wafers, the wafers should be immersed in active water having a pH valve larger than 7 and a positive redox potential. Thus, both of the pH valve and the redox potential should be precisely controlled to improve the deterioration of electrolyte.

Figure 3:
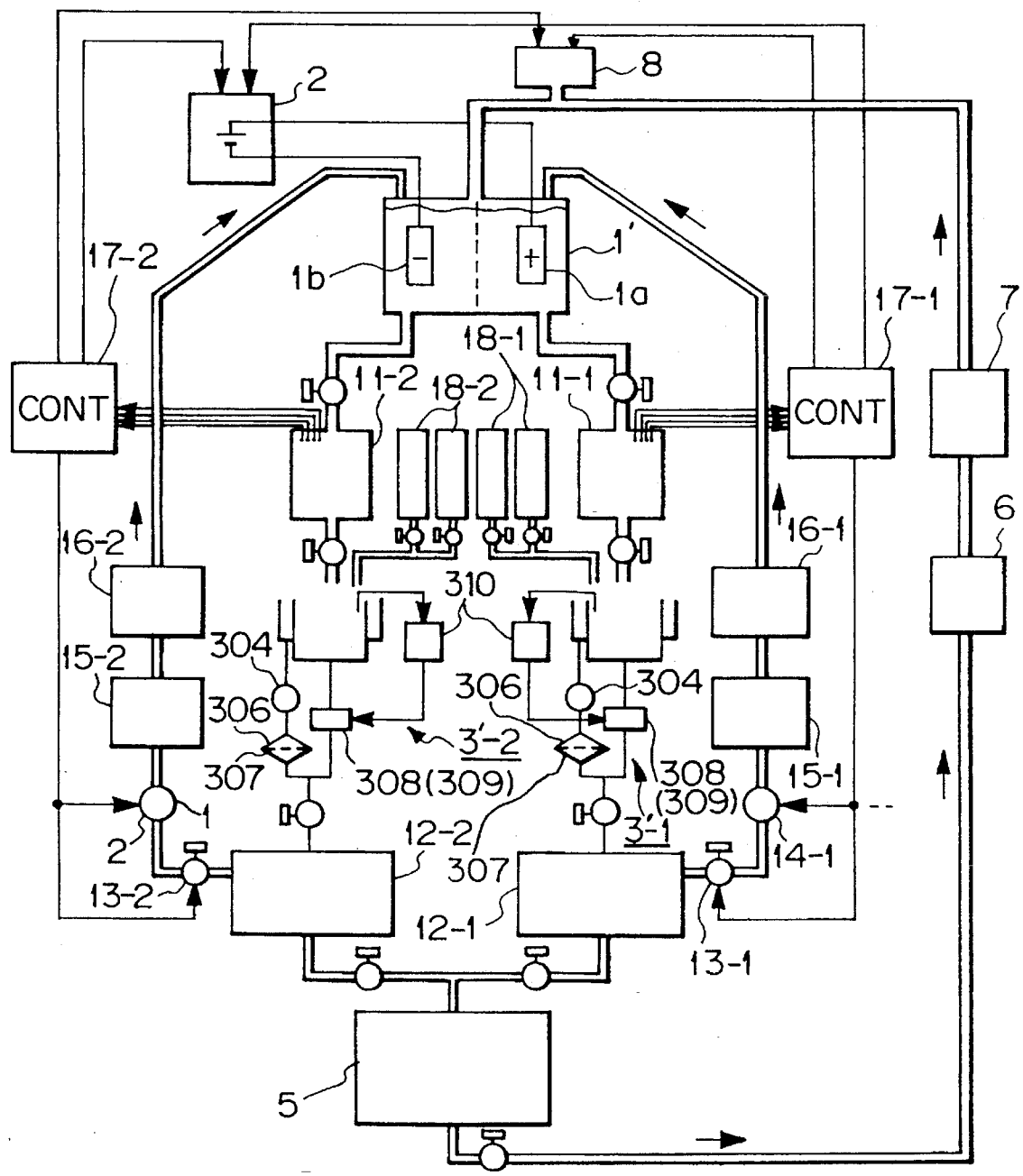
FIG. 3 is a diagram illustrating a first embodiment of the wet processing apparatus according to the present invention.

In FIG. 3, which illustrates a first embodiment of the present invention, a batch form type wet processing apparatus is illustrated. That is, an electrolyte cell 1 of FIG. 1 is modified into an electrolyte cell 1'. Also, a storing cell 11-1, a processing cell 3'-1 corresponding to the processing cell 3-1 of FIG. 1, and a used water storing cell 12-1 are interposed between the electrolyte cell 1' and the used water storing cell 5. A reactivating feedback path including a valve 13-1, a pump 14-1, a water treatment unit 15-1, and an ion exchange unit 16-1 are connected between the used water storing cell 12-1 and the anode side of the electrolyte cell 1, to reactivate the anode water. The reactivating feedback path is controlled by a control circuit 17-1 which receives various sensor signals from the storing cell 11-1. Note that the control circuit 17-1 also controls the DC power supply unit 2 and the supporting electrolyte supplying unit 8. Also, reference numeral 18-1 designates additive storing cells for storing acid solution, alkali solution, oxidizing agent, reducing agent and the like. The additive is selected in accordance with a selected wet process. Similarly, a storing cell 11-2, a processing cell 3'-2 corresponding to the processing cell 3-2 of FIG. 1, and a used water storing cell 12-2 are interposed between the electrolyte cell 1' and the used water storing cell 5. A reactivating feedback path including a valve 13-2, a pump 14-2, a water treatment unit 15-2, and an ion exchange unit 16-2 are connected between the used water storing cell 12-2 and the cathode side of the electrolyte cell 1, to reactivate the cathode water. The reactivating feedback path is controlled by a control circuit 17-2 which receives various sensor signals from the storing cell 11-2. Note that the control circuit 17-2 also controls the DC power supply unit 2 and the supporting electrolyte supplying unit 8. Also, reference numeral 18-2 designates additive storing cells for storing acid solution, alkali solution, oxidizing agent, reducing agent and the like. The additive is selected in accordance with a selected wet process.

Figure 4:
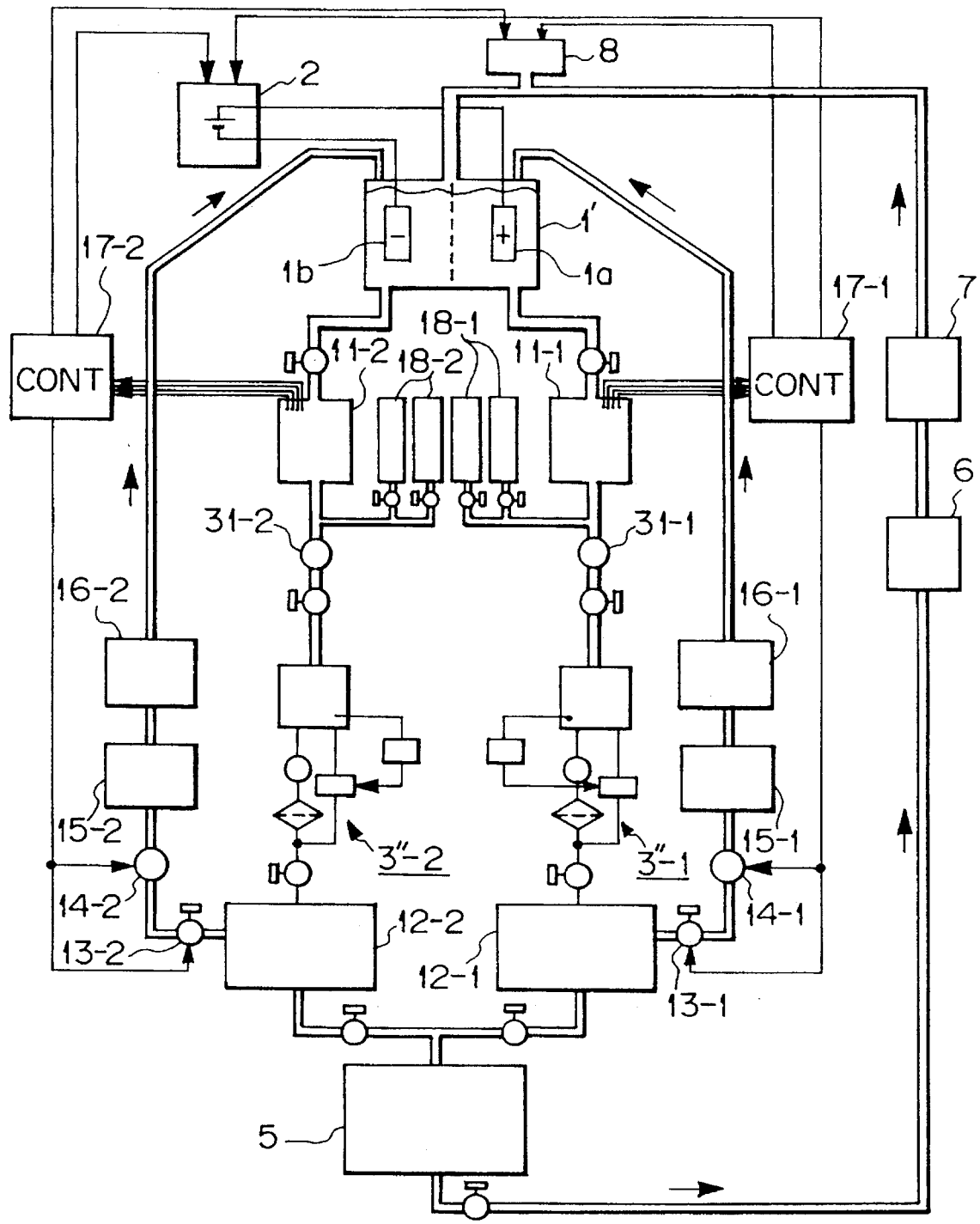
FIG. 4 is a diagram illustrating a second embodiment of the wet processing apparatus according to the present invention.

In FIG. 4, which illustrates a second embodiment of the present invention, a leaf form type wet processing apparatus is illustrated. In FIG. 4, processing units 3"-1 and 3"-2 are of a leaf form type, and pumps 31-1 and 31-2 are provided to spray electrolyte within the processing units 3"-1 and 3"-2 via nozzles (not shown). The other portions are the same as those of the batch form type wet processing apparatus of FIG. 3.

The portions of the wet processing apparatuses of FIGS. 3 and 4 will be explained next in detail.

Figure 5:
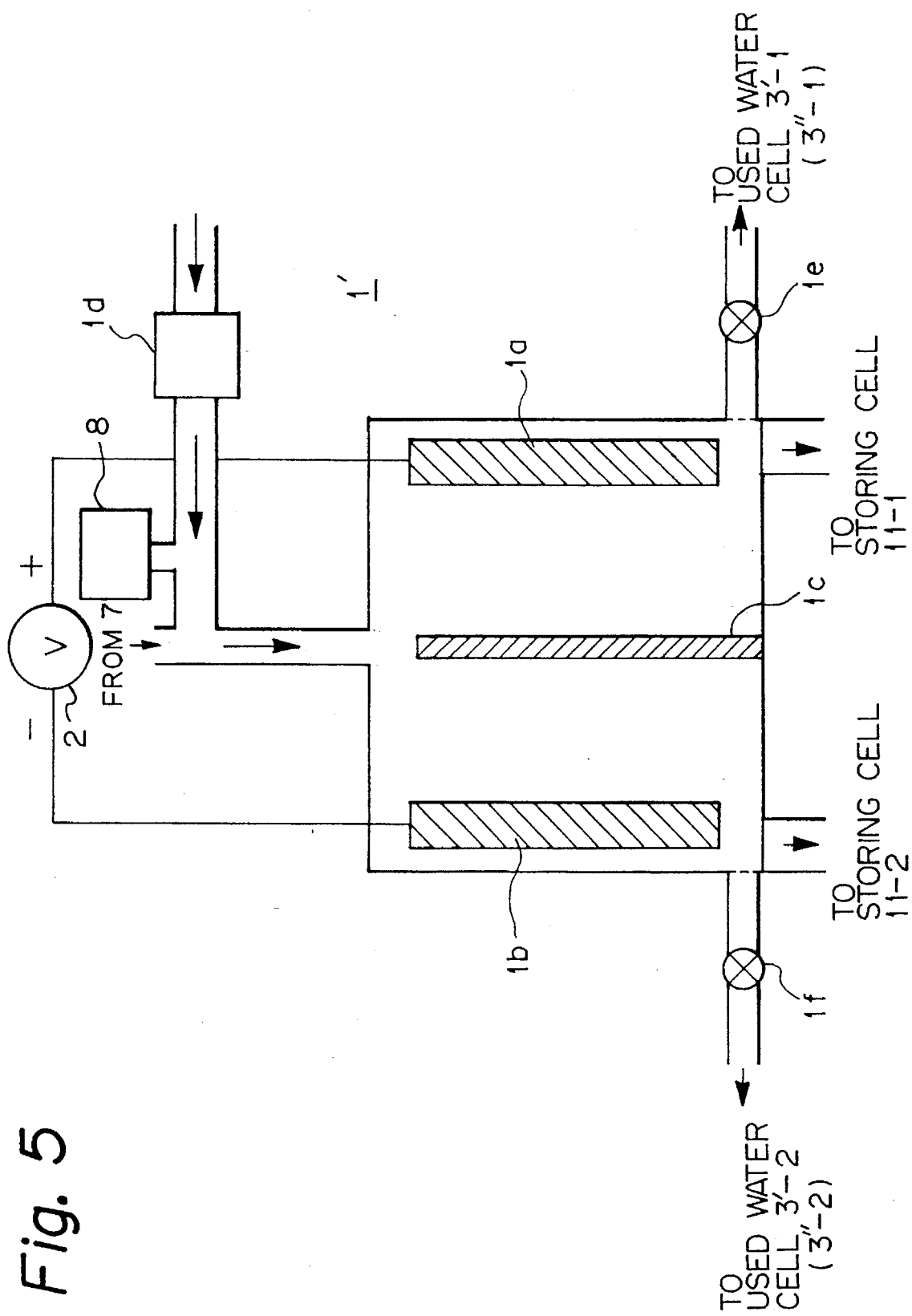
FIG. 5 is a detailed diagram of the electrolyte cell of FIGS. 3 and 4.

In FIG. 5, which is a detailed diagram of the electrolyte cell 1' of FIGS. 3 and 4, a gas pressure pump 1d and pressure valves 1e and 1f leading to the used water storing cells 3'-1 (3"-1) and 3'-2 (3"-2), respectively, are mounted in the electrolyte cell 1'. The gas pressure pump 1d injects inactive gas such as helium gas which is not harmful in a wet process. In this case, the pressure valves 1e and 1f are individually adjusted, so that the pressure within the anode side of the electrolytic cell 1' is independent of the pressure within the cathode side of the electrolytic cell 1'. For example, when the pressure valves 1e and 1f are closed and opened, respectively, the pressure within the anode side of the electrolytic cell 1' is increased, and the pressure within the cathode side of the electrolytic cell 1' is decreased. As a result, much electrolyte is obtained in the anode side of the electrolytic cell 1', while less electrolyte is obtained in the cathode side of the electrolytic cell 1'.

Assume that ammonium chloride ($NH_4C1$) is used as electrolyte in the electrolytic cell 1'. In this case, in the anode region of the electrolytic cell 1', the following reactions occur:

$$2H_2O \rightarrow O_2 + 4H^+ 4e \qquad (1)$$

$$3H_2O \rightarrow O_3 + 6H^+ + 6e \qquad (2)$$

$$NH_4Cl \rightarrow NH_3 + H^+ + Cl^- \qquad (3)$$

and

$$2Cl^- \rightarrow Cl_2 + 2e \qquad (4)$$

and

$$Cl_2 + 2H_2O \rightarrow 2H^+ + 2HClO + 2e \qquad (5)$$

$$Cl_2 + 4H_2O \rightarrow 6H^+ + 2HClO_2 + 6e \qquad (6)$$

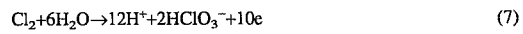

$$Cl_2 + 6H_2O \rightarrow 12H^+ + 2HClO_3^- + 10e \qquad (7)$$

and

$$HClO \rightarrow 3H^+ + ClO_3^- + 2Cl^- \qquad (8)$$

Thus, in the anode region of the electrolytic cell 1', oxygen gas and chlorine gas are generated, and simultaneously, hydrogen ions are emitted into the electrolyte of the anode region. As a result, the electrolyte of the anode region is acidic.

On the other hand, in the cathode region of the electrolytic cell 1', the following reactions occur:

$$2NH_4Cl \rightarrow 2NH_3 + H_2 + 2Cl^- \qquad (9)$$

$$2NH_3 + H_2O \rightarrow 2NH_4^+ + 2OH^- \qquad (10)$$

$$2H_2O + 2e \rightarrow 2OH^- + H_2 \qquad (11)$$

Thus, in the cathode region of the electrolytic cell 1', hydrogen gas and ammonia gas are generated, and simultaneously, hydroxide ions are emitted into the electrolyte of the cathode region. As a result, the electrolyte of the cathode region is alkalic.

In a low pressure state of the electrolyte, the generation of the above-mentioned gas is enhanced. That is, in the anode region of the electrolytic cell 1', the generation of oxygen ($O_2$) gas and chlorine gas is enhanced, while the generation of ozone ($O_3$) gas is suppressed. Also, the generation of $HClO_3$ and $HClO_3$ is suppressed by the reduction of chlorine concentration in the electrolyte. On the other hand, in the cathode region of the electrolytic cell 1', the generation of hydrogen gas is enhanced, and accordingly, the generation of hydroxide ions is enhanced. In summary, the concentration of hydrogen ions is increased in the anode region, and the concentration of hydroxide ions is increased in the cathode region.

In a high pressure state of the electrolyte, the generation of the above-mentioned gas is suppressed. That is, in the anode region of the electrolytic cell 1', the generation of oxygen ($O_2$) gas and chlorine gas is suppressed, while the generation of ozone ($O_3$) gas is enhanced. Also, the generation of $HClO$ and $HClO_3$ is enhanced by the increase of chlorine concentration in the electrolyte. Thus, a high ROP electrolyte is generated. On the other hand, in the cathode region of the electolytic cell 1', the generation of hydrogen gas is suppressed, and accordingly, the generation of hydroxide ions is suppressed. Thus, a highly oxidative electrolyte is generated. In summary, the concentration of hydrogen ions is decreased in the anode region, and the concentration of hydroxide ions is decreased in the cathode region.

Examples of the storing cell 11-1 (11-2) of FIGS. 3 and 4 will be explained with reference to FIGS. 6 through 12. Note that the storing cell 11-1 has the same configuration as the storing cell 11-2, and therefore, only the storing cell 11-2 is explained.

Figure 6:
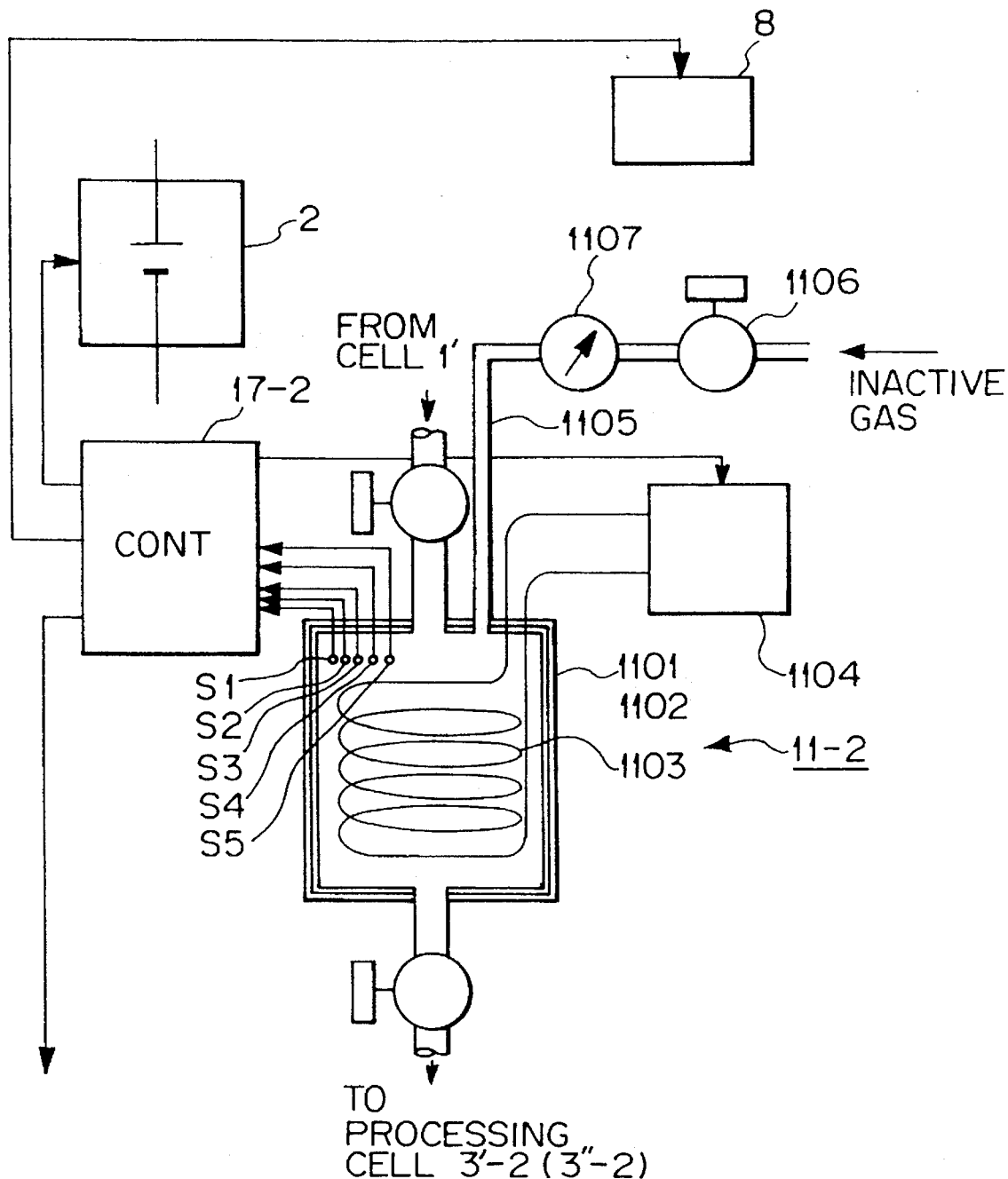
FIG. 6 is a diagram illustrating a first example of the storing cell of FIGS. 3 and 4.
Figure 7A:
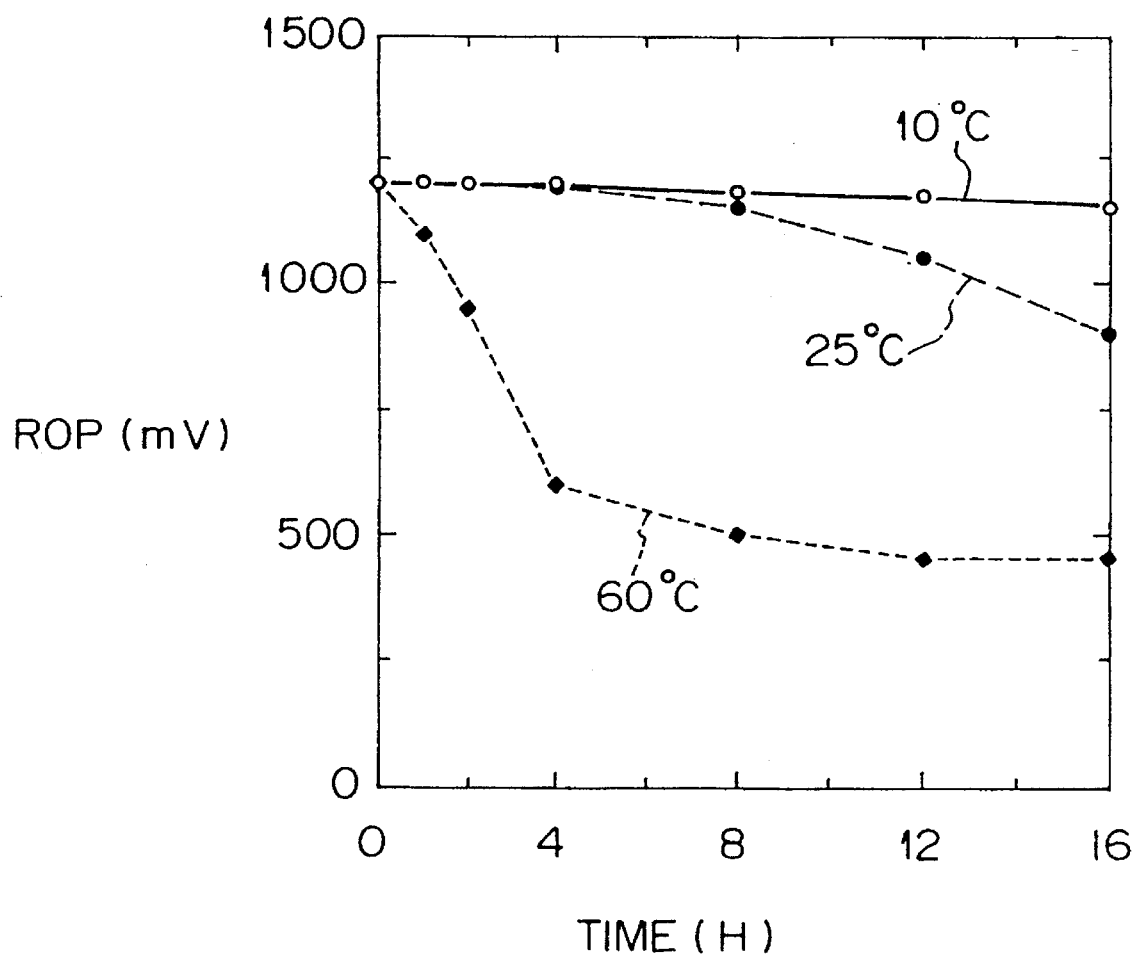
FIGS. 7A and 7B are diagrams showing redox potential characteristics of the storing cell of FIG. 6.
Figure 7B:
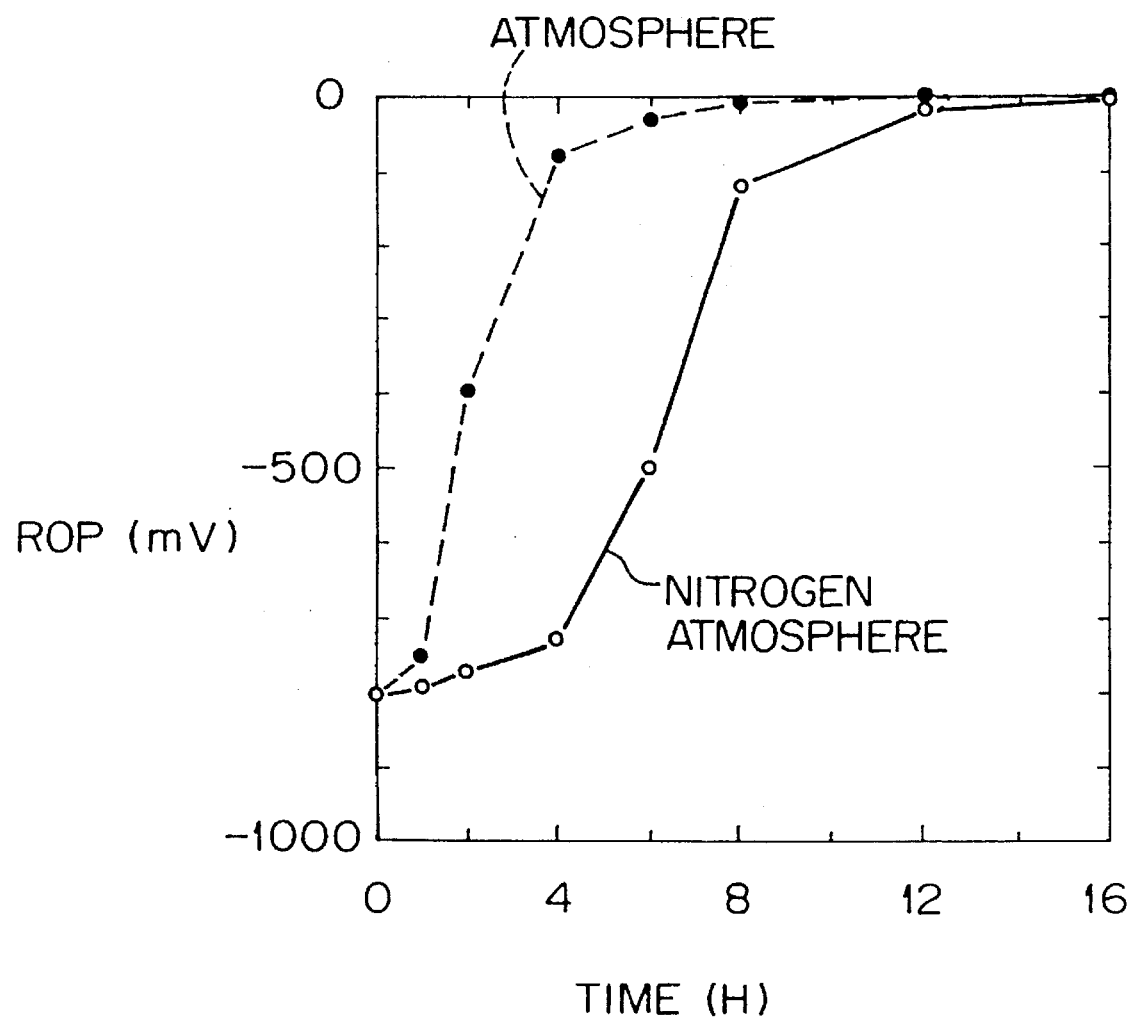

In FIG. 6, which illustrates a first example of the storing cell 11-2, the storing cell 11-2 is of a closed top container type formed by an acid resistant and alkali resistant fluorine plastic member 1101 covered by a heat-insulating (adiabatic) member 1102. In this case, the heat-insulating member 1102 serves also as a light shield. Also, the storing cell 11-2 includes a cooling coil 1103 controlled by a cooler 1104.

Further, provided within the storing cell 11-2 are a temperature sensor S1 for detecting the temperature of electrolyte, a level sensor S2 for detecting a surface level of electrolyte, a pH sensor S3 for detecting a pH valve of electrolyte, a redox sensor S4 for detecting a redox potential of electrolyte, and a particle sensor S5 for detecting particles within the electrolyte.

The control circuit 17-2 controls the cooler 114 in accordance with the detection signal of the temperature sensor S1. For example, referring to FIG. 7A which shows a redox potential ROP of ammonium chloride electrolyte having an initial redox potential of 1200 mV with respect to time, when the temperature is 60° C., the redox potential ROP is greatly reduced after one hour has passed. Contrary to this, when the temperature is 10° C., the redox potential ROP is unchanged even after ten hours have passed. In this case, the temperature of ammonium chloride electrolyte is preferably 5 to 15° C. If this temperature is lower than 5° C., this electrolyte may be partially frozen. Thus, the temperature of electrolyte within the storing cell 11-2 can be made to be within a relatively low range due to the heat-insulating member 112 and the cooling coil 1103 (cooler 1104), which suppresses the deterioration of electrolyte within the storing cell 11-2.

Also, in FIG. 6, a gas inlet pipe 1105 having a valve 1106 and a regulator 1107 is provided to introduce inactive gas such as nitrogen gas into the storing cell 11-2. For example, referring to FIG. 7B which shows a redox potential ROP of ammonium chloride electrolyte having an initial redox potential −800 mV with respect to time, when the storing cell 11-2 is opened to the atmosphere, the redox potential ROP is opened when one hour has passed. Contrary to this, when the storing cell 11-2 is filled with nitrogen, the redox potential ROP is maintained approximately at the initial valve even after four hours have passed.

Figure 8:
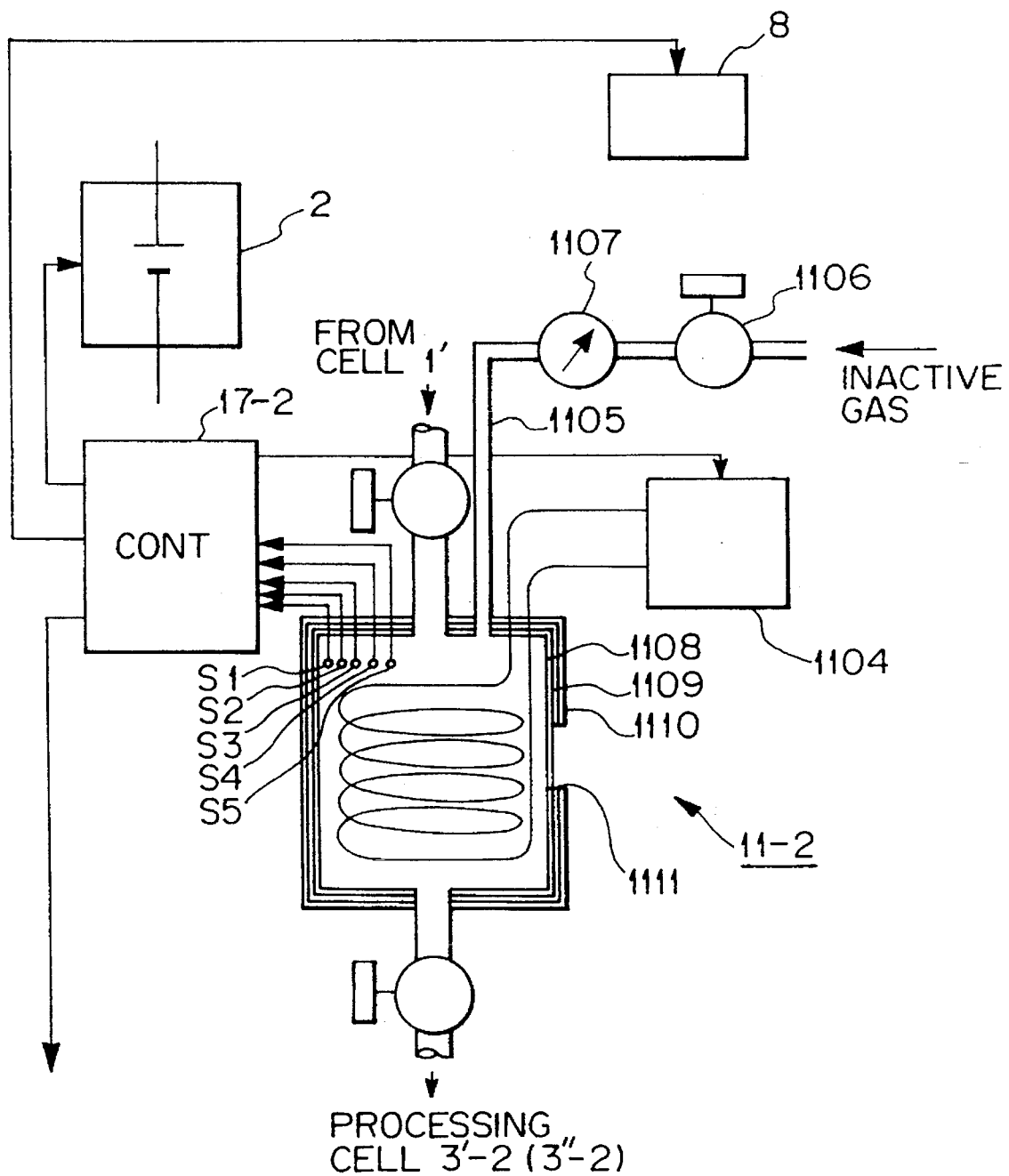
FIG. 8 is a diagram illustrating a second example of the storing cell of FIGS. 3 and 4.

In FIG. 8, which illustrates a second example of the storing cell 11-2, the storing cell 11-2 is made of an acid resistant, alkali resistant and transparent quartz member 1108 covered by a mirror 1109 which is also covered by a heat-insulating member 1110. Also, a window 1111 is provided in the mirror 1109 and the heat-insulating member 1110. Electromagnetic waves or a magnetic field is introduced via the window 1111 into the storing cell 11-2, thus suppressing the deterioration of electrolyte therein.

Figure 9:
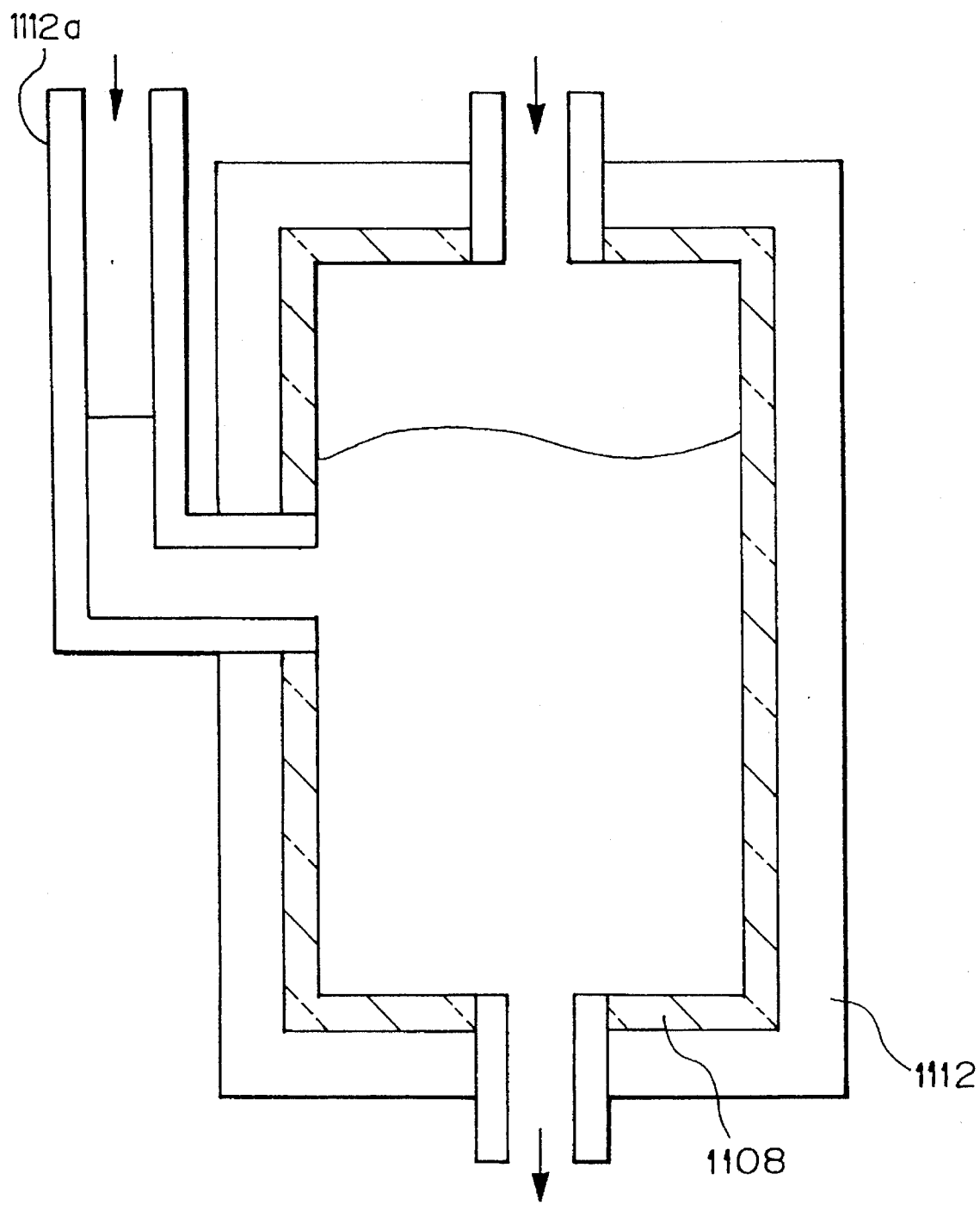
FIG. 9 is a diagram illustrating a third example of the storing cell of FIGS. 3 and 4.

In FIG. 9, which illustrates a third example of the storing cell 11-2 of FIGS. 3 and 4, a coolant circulating cell 1112 covers the quartz member 1108. That is, the coolant circulating cell 1112 serves as the heat-insulating member 1102 and the cooling coil 1103 (cooler 1104) of FIG. 6, thus maintaining the temperature of electrolyte within the storing cell 11-2 at a low temperature such as 5 to 15° C.

Figure 10:
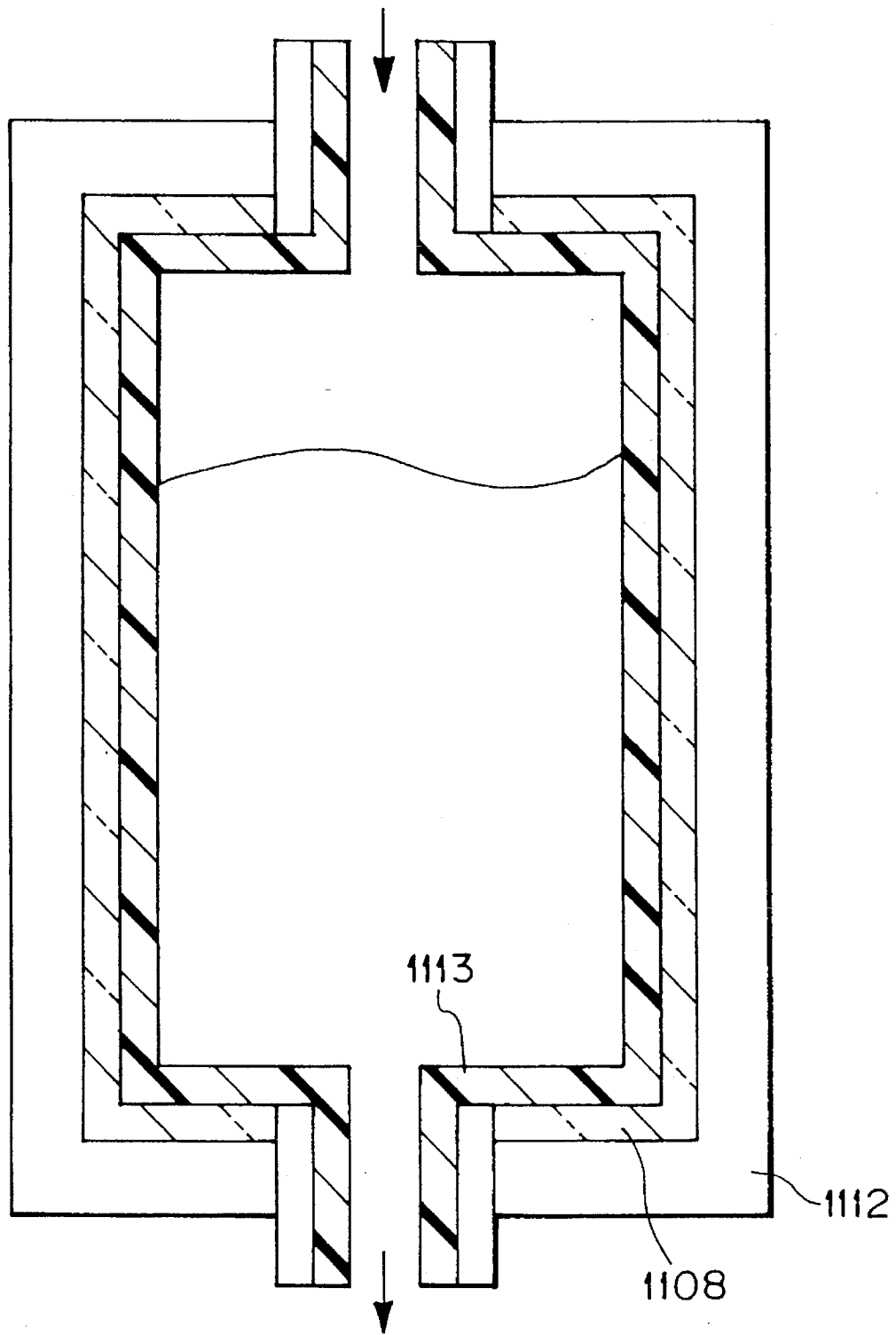
FIG. 10 is a diagram illustrating a fourth example of the storing cell of FIGS. 3 and 4.

In FIG. 10, which illustrates a fourth example of the storing cell 11-2 of FIGS. 3 and 4, a fluorine element 1113 is covered on an inner face of the quartz member 1108 of FIG. 9, to prevent metal contamination of the quartz member from being eluted into the electrolyte within the storing cell 11-2. Note that fluoride plastic can be used instead of the fluorine element 1113.

Figure 11:
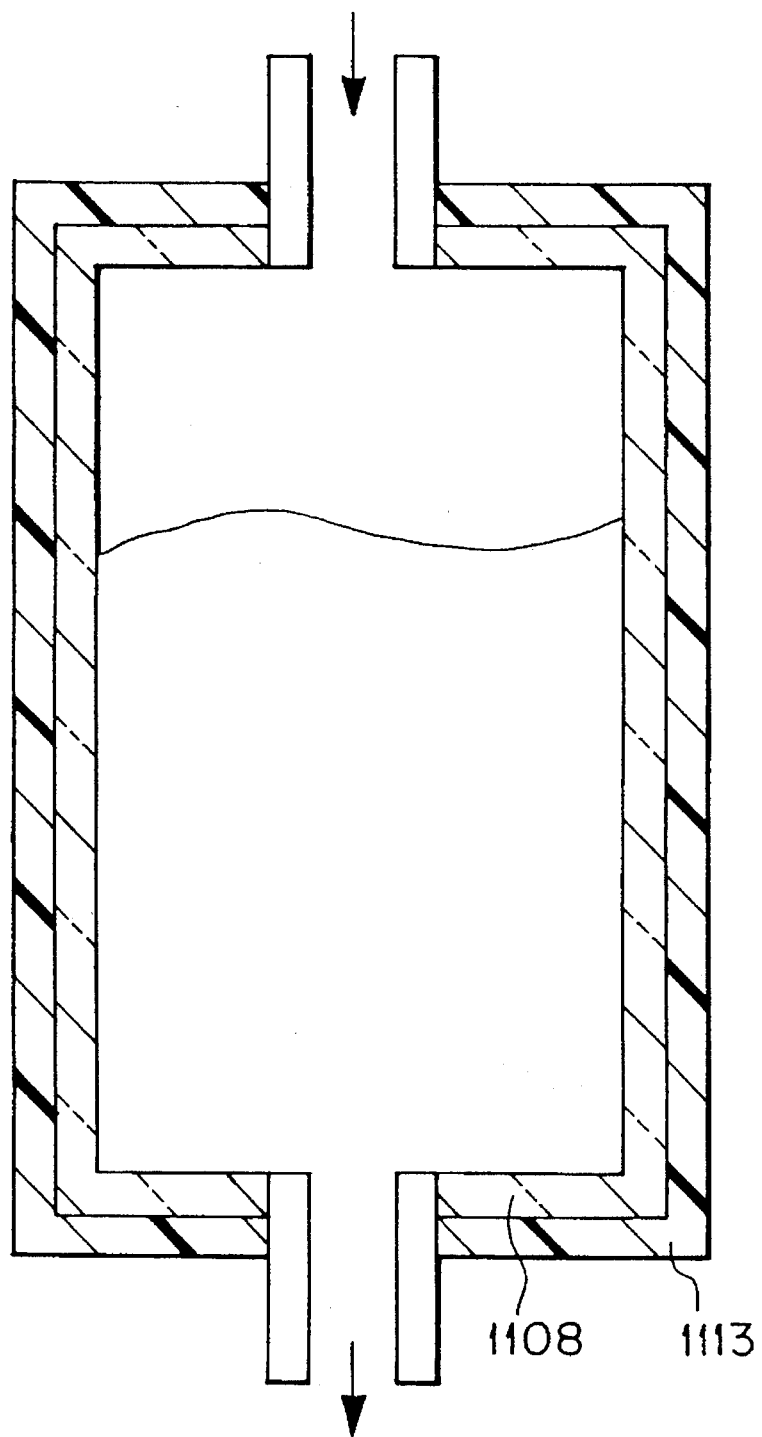
FIG. 11 is a diagram illustrating a fifth example of the storing cell of FIGS. 3 and 4.

In FIG. 11, which illustrates a fifth example of the storing cell 11-2 of FIGS. 3 and 4, the quartz member 1108 is covered by a metal layer 1113 which serves as the mirror 1109 of FIG. 8.

Examples of the processing cells 3'-1 (3"-1) and 3'-2 (3"-2) of FIGS. 3 and 4 will be explained next with reference to FIGS. 12 through 14. Note that the processing cell 3'-1 (3"-1) has the same configuration as the processing cell 3'-2 (3"-2), and therefore, only the processing cell 3'-2 (3"-2) is explained.

Figure 12:
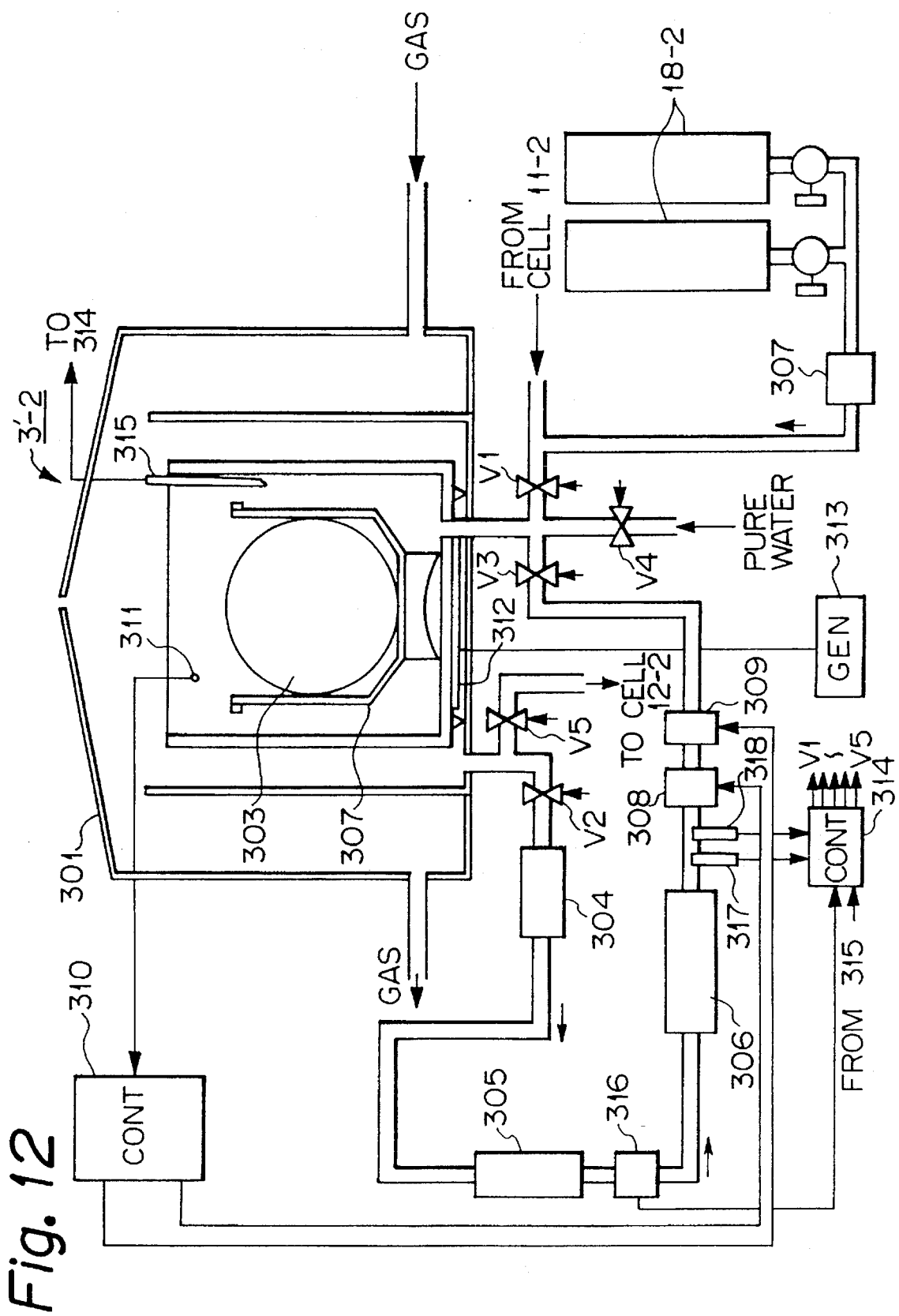
FIG. 12 is a diagram illustrating a first example of the processing cell of FIG. 3.
Figure 13:
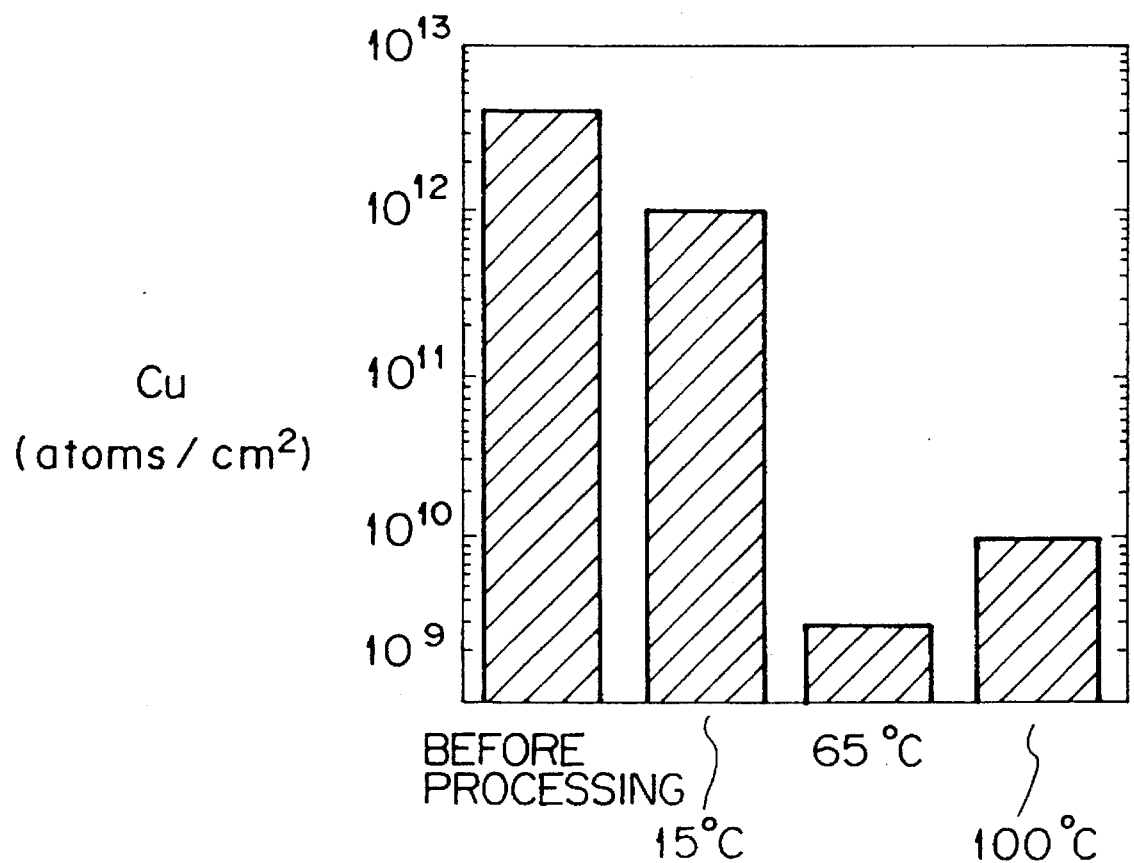
FIG. 13 is a diagram showing the wet processing characteristics with respect to the temperature of electrolyte.

In FIG. 12, which illustrates an example of the processing cell 3'-2 of FIG. 3, the processing cell 3'-2 includes a closed top container 301 which has a wafer carrier 302 including wafers 303 mounted thereon.

Electrolyte is supplied from the storing cell 11-2 via a valve V1 to the processing cell 3'-2, and is returned by a feedback path to the processing cell 3'-2. The feedback path is formed by a pump 304, a particle filter 305, and a metal impurity filter 306, and this feedback path is turned ON and OFF by valves V2 and V3.

Also, the processing cell 3'-2 can receive pure water via a valve V4. The processing cell 3'-2 exhausts used electrolyte via a valve V5 to the used water cell 12-2.

During a wet process, acid solution, alkali solution, oxidizer, reducer, chelate or the like is selected from the additive storing cells 18-2 via an adjusting pump 307. For example, a very small amount of alkali solution such as ammonia water is added to the anode water, or a very small amount of oxidizing agent such as ozone is added to the cathode water, thus exhibiting the same clearing effect for the wafers as a solution of ammonia, $H_2O_2$, and pure water with a ratio of 1:4:20. In this case, gas such as ozone gas is supplied by bubbling to the processing cell 3'-2. Also, a very small amount of acid such as hydrochloric acid, nitric acid or formic acid is added to the anode water, to exhibit an acid clearing effect. Further, a very little fluoride acid is added to the anode water, to exhibit an etching effect for silicon oxide and a removing effect for removing metal between silicon oxide and silicon gas. Further, a very small amount of chelate is added to the anode water, to prevent metal from re-adhering to the wafers 303 due to the formation of metal complex compound on the wafers 303.

During a wet processing, gas such as nitrogen or hydrogen is introduced via a valve and a regulator (not shown) into the processing cell 3'-2, and gas such as chlorine or oxygen is introduced into a valve and a regulator (not shown) into the processing cell 3'-1.

Also, provided in the feedback path are a heater 308 and a cooler 309 for adjusting the temperature of electrolyte within the processing cell 3'-2. In this case, a control circuit 310 controls the heater 308 and the cooler 309 in accordance with a detection signal of a temperature sensor 311 within the processing cell 3'-2. For example, as shown in FIG. 13, when removing metal contamination such as Cu on the wafers having an initial concentration of $4 \times 10^{12}$ atoms/cm$^2$ by using fluorine acid, the concentration of Cu is reduced by a wet processing at 65° C. to $3 \times 10^9$ atoms/cm$^2$, and the concentration of Cu is reduced by a wet processing at 100° C. to $1 \times 10^{10}$ atoms/cm$^2$. However, the concentration of Cu is reduced by a wet processing at 15° C. to $1 \times 10^{12}$ atoms/cm$^2$. That is, generally, the temperature of electrolyte within the processing cell 3'-2 has to be relatively high (20° to 27° C.) to enhance the activity of electrolyte. This is achieved by the heater 308, the cooler 309, the control circuit 310 and the temperature sensor 311.

Further, an ultrasonic wave generating plate 312 is provided within the processing cell 3'-2 to enhance the activity of electrolyte therein. The plate 312 is vibrated by an ultrasonic wave generating unit 313. In this case, the frequency of the ultrasonic waves is 10 kHz to 10 MHz, preferably, 100 kHz to 1 MHz, and the power of the ultrasonic waves is 10 W to 1000 W, preferably, 100 to 800 W. When the frequency and power of the ultrasonic waves are too low, the efficiency of reaction is low. On the other hand, if the frequency and power of the ultrasonic waves are too high, the wafers 303 are damaged.

The valves V1 to V5 are controlled by a valve controller 314 which receives various monitoring signals. That is, a detection signal of a level sensor 315 provided within the processing cell 3'-2, a detection signal of a particle sensor 316, a detection signal of a redox sensor 317, and a detection signal of a pH sensor 318 are supplied to the valve controller 314.

When the surface level of electrolyte within the processing cell 3'-2 is lower than a predetermined low level, the level sensor 315 generates a low indication signal. As a result, the valve controller 314 opens the valve V1, so that electrolyte is supplied from the storing cell 11-2 to the processing cell 3'-2. Then, when the level of electrolyte within the processing cell 3'-2 reaches the predetermined low level, the valve controller 314 closes the valve V1. On the other hand, when the level of electrolyte within the processing cell 3'-2 is higher than a predetermined high level, the level sensor 315 generates a high indication signal. As a result, the valve controller 314 opens the valve V5, so that electrolyte is extracted from the storing cell 11-2 to the used water storing 12-2. Then, when the level of electrolyte within the processing cell 3'-2 reaches the predetermined high level, the valve controller 314 closes the valve V1.

Also, when the detection signal of the redox sensor 317 or the pH sensor 318 is deviated a little from an optimum range, the valve controller 314 opens the valve V1, so that electrolyte is supplied from the storing cell 11-2 to the processing cell 3'-2. Further, when the detection signal of the redox sensor 317 or the pH sensor 518 is deviated greatly from an optimum range, the electrolyte within the processing cell 3'-2 is replaced by new electrolyte. That is, the valve controller 314 opens the valve V5 for a predetermined time period, so as to completely exhaust the electrolyte from the processing cell 3'-2. Then, the valve controller 314 closes the valve V5 and opens the valve V1, so that new electrolyte is filled in the processing cell 3'-2.

Also, when the number of particles counted by the particle sensor 316 exceeds a predetermined valve, the electrolyte within the processing cell 3'-2 is replaced by new electrolyte in the same way as above. Even after the replacement of electrolyte, when the number of particles counted by the particle sensor 316 exceeds the predetermined valve, the filter of the particle filter 305 is replaced by a new one.

Also, when cleaning the wafers 303 by pure water, the valve controller 314 opens the valves V4 and V5, so that pure water is circulated within the processing cell 3'-2.

Figure 14:
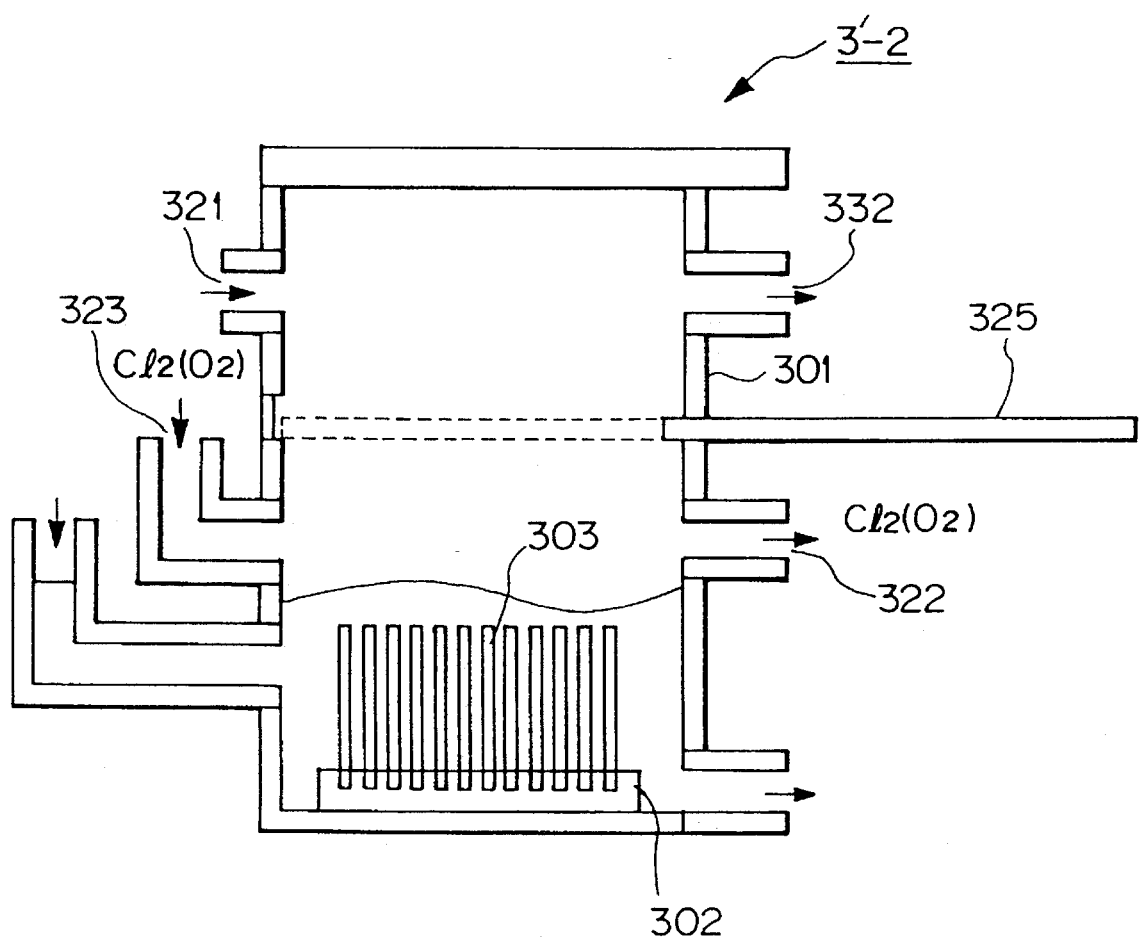
FIG. 14 is a diagram illustrating a modification of the processing cell of FIG. 12.

In FIG. 14, which is a modification of the processing cell 3'-2 of FIG. 12, a gas inlet 321 and a gas outlet 322 are provided on the upper side of the processing cell 3'-2, and a gas inlet 323 and a gas outlet 324 are provided on the lower side of the processing cell 3'-2. The upper and lower sides of the processing cell 3'-2 can be partitioned by moving a partition plate 325. That is, when supplying undangerous gas such as nitrogen to the processing cell 3'-2, the partition plate 325 is removed, so that the gas is introduced via the inlets 321 and 323 into the processing cell 3'-2, and is exhausted from the outlet 322 and 324. On the other hand, when supplying dangerous gas such as chlorine or oxygen to the processing cell 3'-2, the partition plate 325 is moved into the processing cell 3'2, so that the gas is introduced only via the inlet 323 into the processing cell 3'-2, and is exhausted only from the outlet 324.

Figure 15:
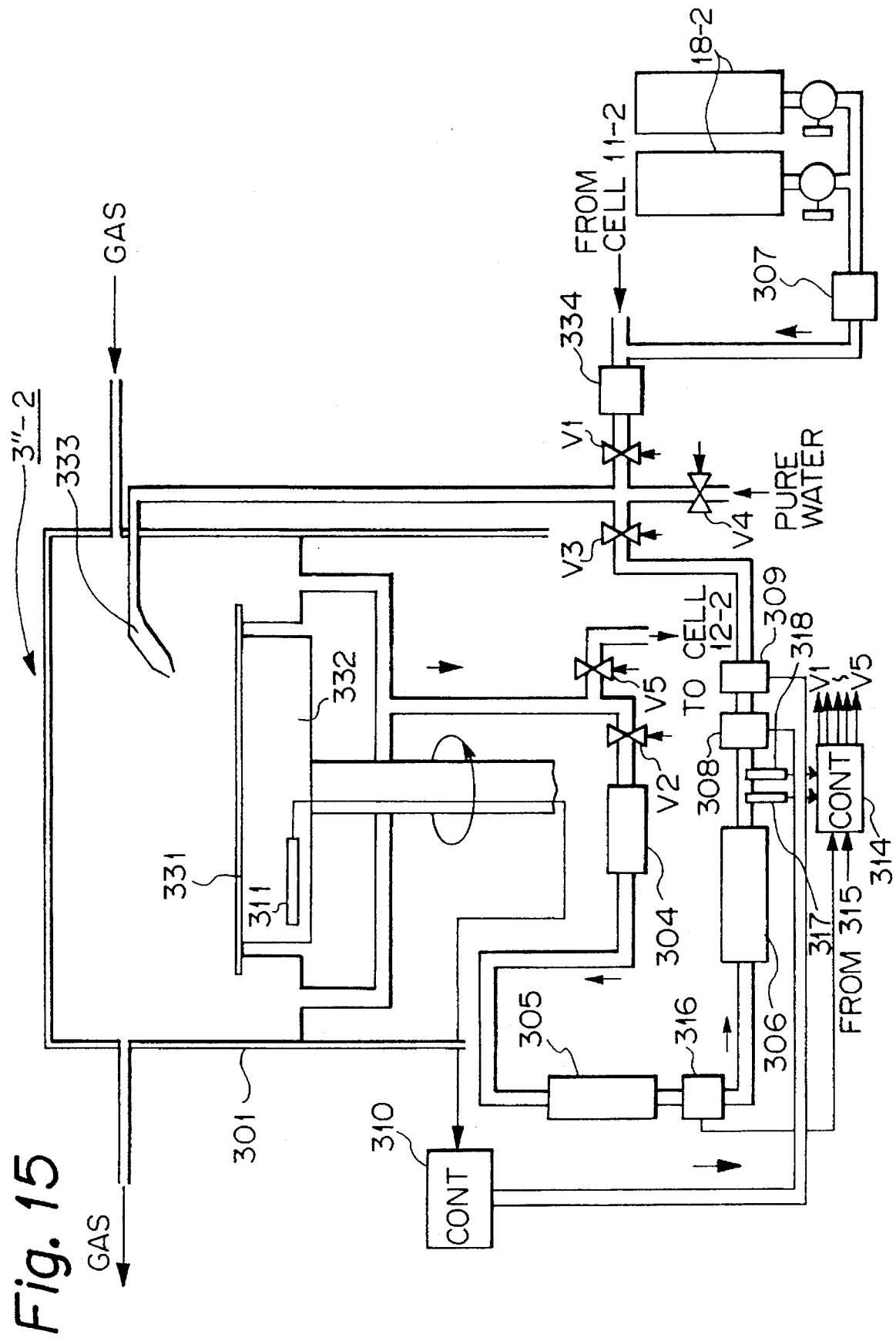
FIG. 15 is a diagram illustrating a first example of the processing cell of FIG. 4.

In FIG. 15, which illustrates an example of the processing cell 3"-2 of FIG. 4, a wafer 331 is mounted on a rotating suction pad 332. Electrolyte is sprayed from a nozzle 333 onto the wafer 331. In this case, the electrolyte at the nozzle 333 is pressurized by a pump 334. In FIG. 14, the ultrasonic wave generating plate 312 of FIG. 12 is not provided, however, this plate can be provided. The other elements are the same as those of FIG. 12.

The other adjustment systems of temperature of electrolyte within the processing cell will be explained next with reference to FIGS. 16 and 17.

Figure 16:
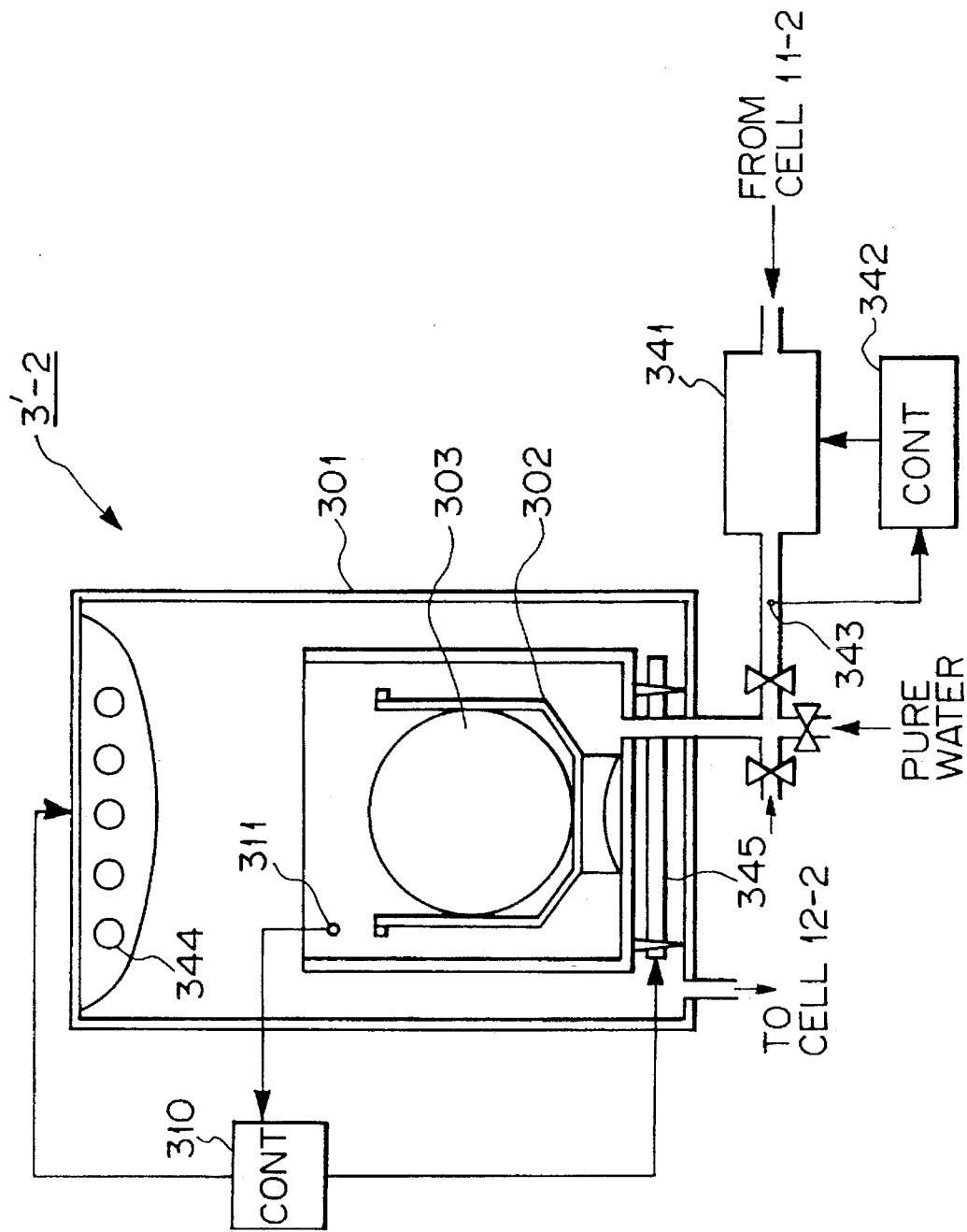
FIG. 16 is a diagram illustrating a second example of the processing cell of FIG. 3.

In FIG. 16, a constant temperature bath 341, which corresponds to the heater 317 and the cooler 318 of FIG. 12, is interposed between the storing cell 11-2 and the processing cell 3'-2 of FIG. 12. The constant temperature bath 341 is controlled by a control circuit 342 which receives a detection signal of a temperature sensor 343. The constant temperature bath 341 can slowly change the temperature of electrolyte, to suppress the deterioration thereof.

Also, a lamp 344 such as an infrared lamp and an ultraviolet lamp is provided on the top of the processing cell 3'-2. The iterated lamp can heat only the wafers 303; the temperature of electrolyte is not so increased, thus increasing the life time of the electrolyte. In this case, the frequency of infrared is selected, so that the infrared is absorbed by the wafers and penetrates the electrolyte. The ultraviolet lamp enhances reaction between the surface of the wafers and the electrolyte. In this case, the power of the ultraviolet lamp is 10 to 200 W, preferably, 20 to 100 W. When the power of the ultraviolet lamp is too low, the enhancement of reaction is reduced. On the other hand, when the power of the ultraviolet lamp is too high, the control of an etching amount or the like is deteriorated. Note that the infrared lamp and the ultraviolet lamp can be simultaneously provided.

Further, a heater 345 is provided on the bottom of the processing cell 3'-2. The heater 345 heats the bottom side of the wafers 303.

The lamp 344 and the heater 345 are also controlled by the control circuit 310.

FIG. 16, although the constant temperature bath 341, the lamp 344 and the heater 345 are simultaneously provided; however, only one or two of them need be provided.

Figure 17:
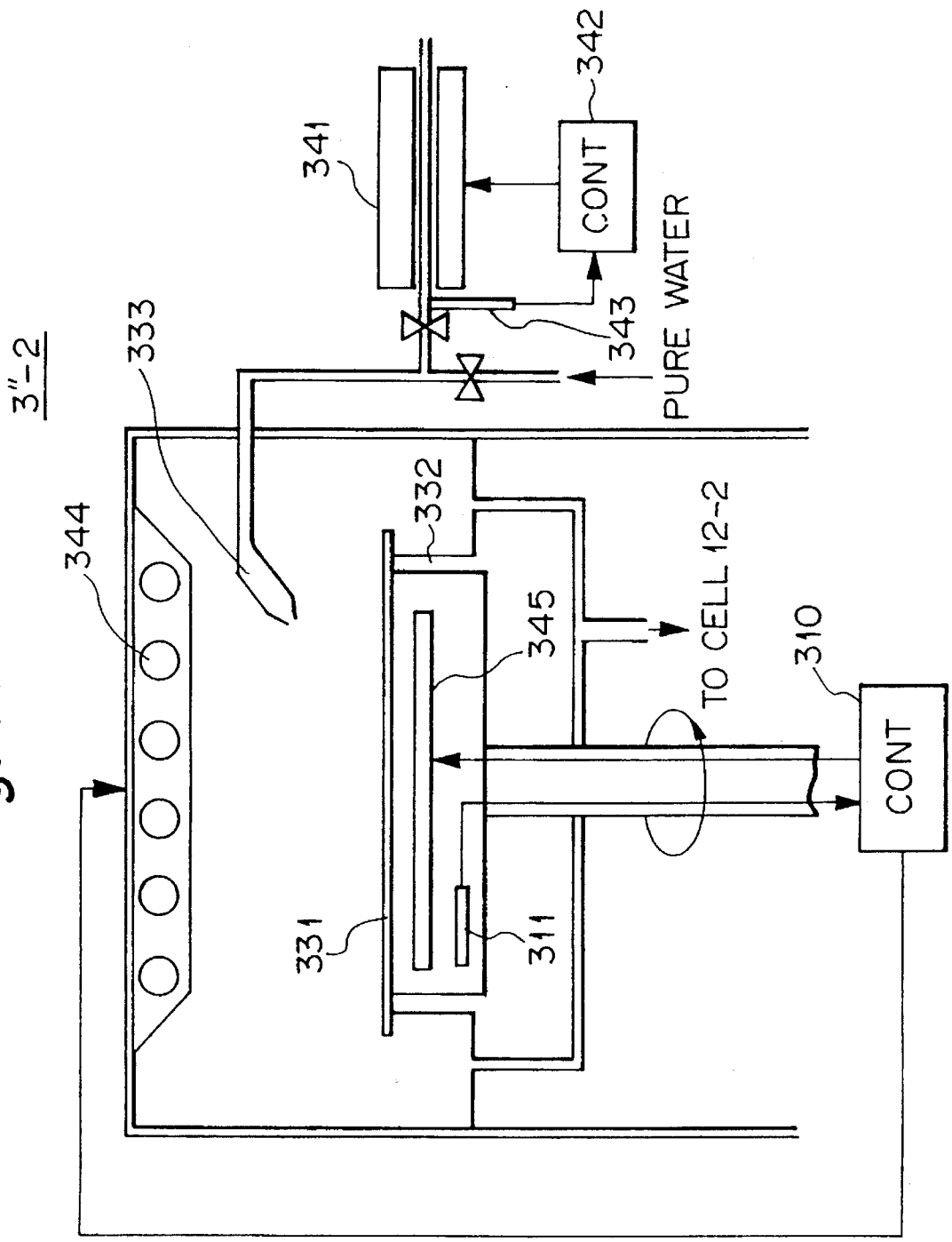
FIG. 17 is a diagram illustrating a second example of the processing cell of FIG. 4.

In FIG. 17, a constant temperature bath 341, which corresponds to the heater 317 and the cooler 318 of FIG. 15, is interposed between the storing cell 11-2 and the processing cell 3"-2 of FIG. 15. The constant temperature bath 341 is controlled by the control circuit 342.

Also, a lamp 344 such as an infrared lamp and a ultraviolet lamp is provided on the top of the processing cell 3"-2.

Further, a heater 345 is provided in the rotating suction pad 332 of the processing cell 3'''-2. The heater 345 heats the rotating suction pad 332, i.e., the bottom side of the wafer 331.

The lamp 344 and the heater 345 are also controlled by the control circuit 310 which receives a detection signal of the temperature sensor 311 provided in the rotating suction pad 331.

Also, in FIG. 17, although the constant temperature bath 341, the lamp 344 and the heater 345 are simultaneously provided; however, only one or two of them need be provided.

Figure 18:
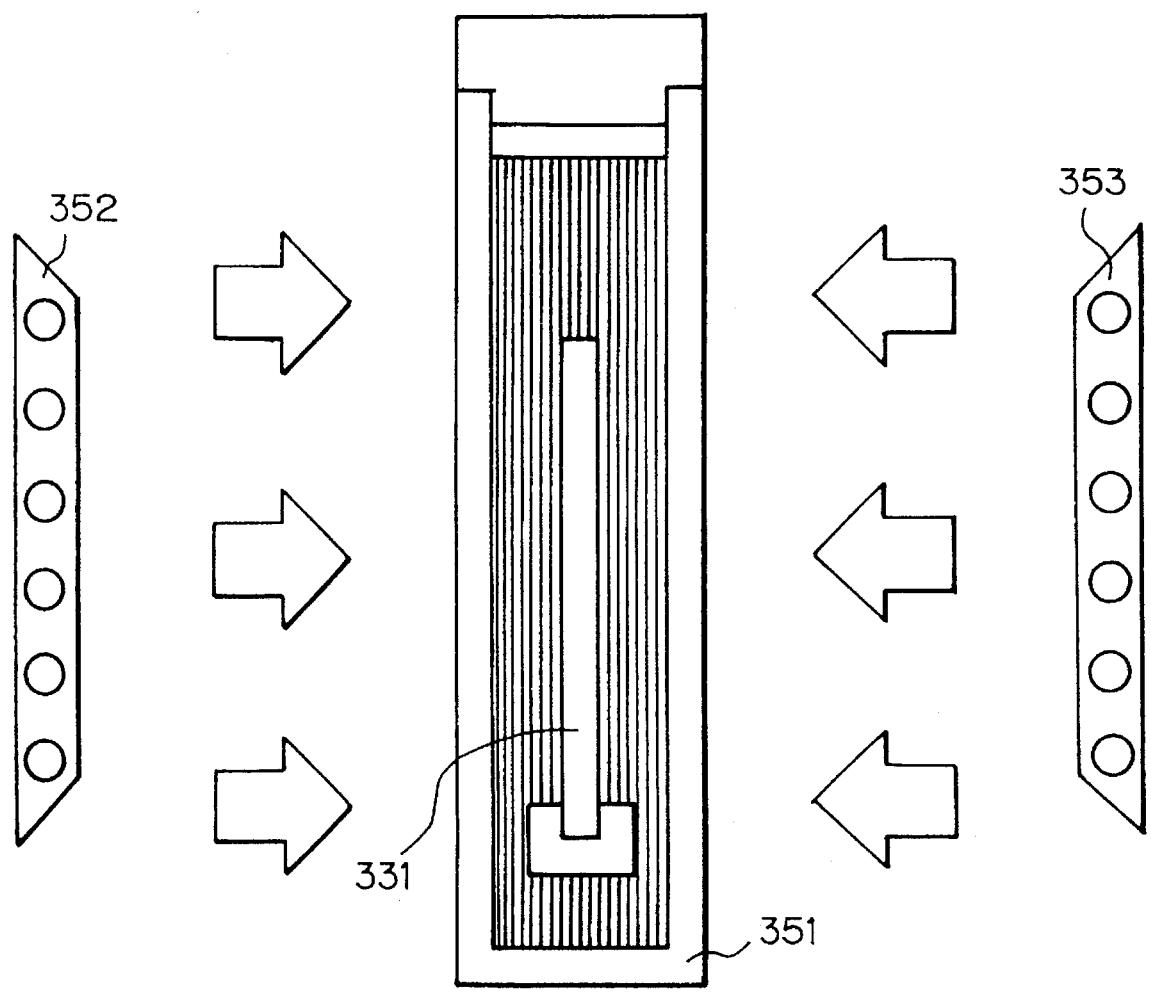
FIG. 18 is a diagram illustrating a modification of the processing cell of FIG. 17.

In FIG. 18, which is a modification of the processing cell 3'-2 of FIG. 17, the wafer 331 is enclosed in a quartz element 351 filled with electrolyte, and two lamps 352 and 353 surround the quartz element 351. As a result, only the wafer 331 is effectively heated.

Figure 19:
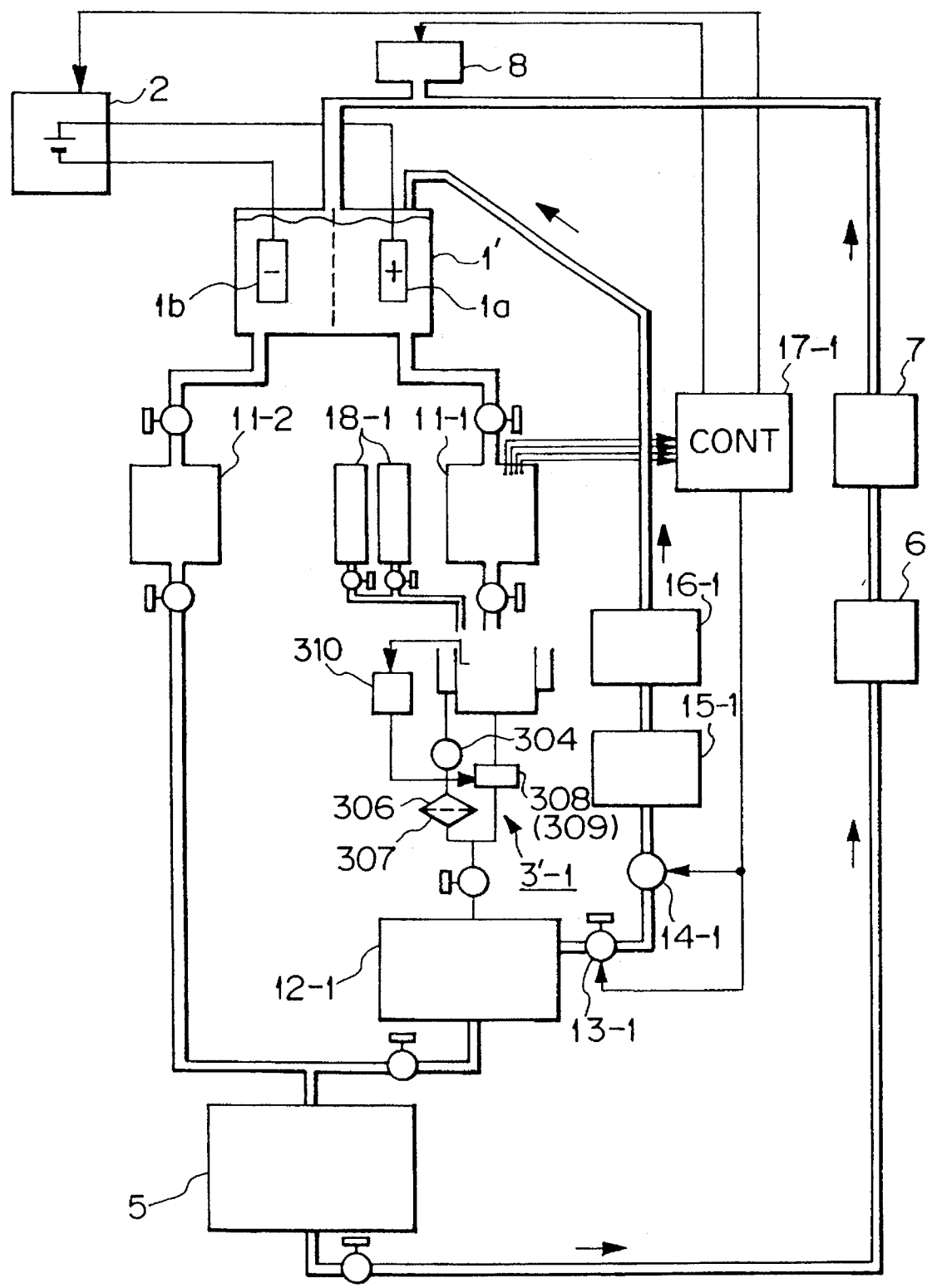
FIG. 19 is a diagram illustrating a modification of the wet processing apparatus of FIG. 3.

In the above-described embodiments, although use is made of the anode active water and the cathode active water, just one of the anode active water and the cathode active water can be used. For example, as illustrated in FIG. 19, if only the anode active water is used, the storing cell 11-2 is directly connected to the used water storing cell 5. In other words, the processing cell 3'-2 and the used water cell 12-2 and the feedback path (13-2~17-2) of FIG. 3 are deleted. Therefore, before the used anode water is neutralized with the used cathode water in the used water storing cell 5, the used anode water is reactivated by the feedback path (12-1~17-1) and returns to the anode region of the electrolytic cell 1'. Thus, the recycling efficiency is also improved.

Figure 20:
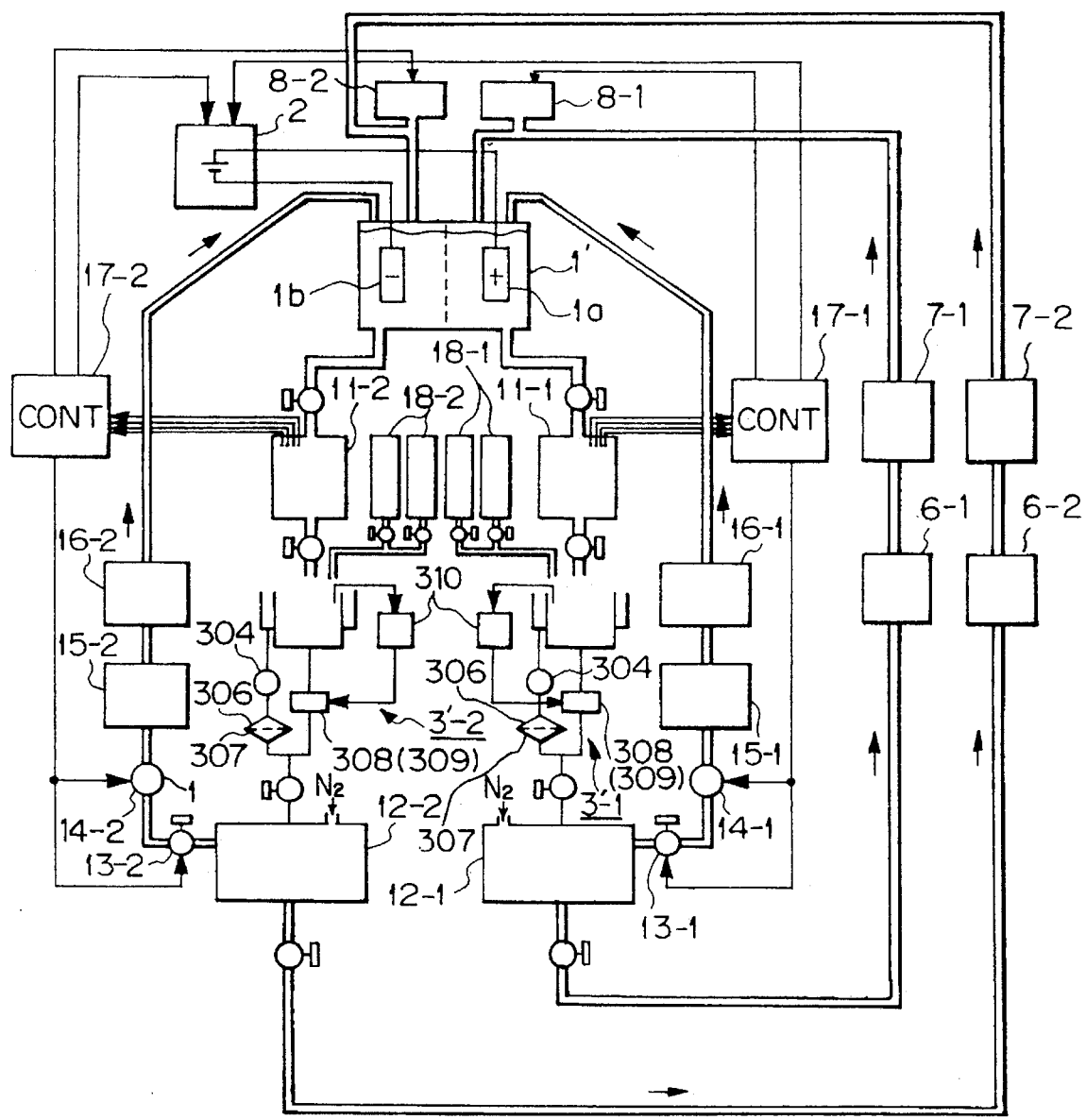
FIG. 20 is a diagram illustrating a modification of the wet processing apparatus of FIG. 3.

Also, in the above-described embodiments, although the electrolyte supplying unit 8 is commonly provided for the anode water and the cathode water, it is possible to provide an electrolyte supplying unit 8-1 for the anode water and an electrolyte supplying unit 8-2 for the cathode water as illustrated in FIG. 20. As a result, different kinds of electrolyte can be supplied to the anode water and the cathode water. For example, hydrochloric acid is supplied to the anode water, while ammonia water is supplied to the cathode water. In this case, the used water processing cell 5 of FIG. 3 is not provided. In addition, a water treatment unit 6-1 and an ion exchange unit 7-1 for negative ions are provided between the used water processing cell 12-1 and the anode region of the electrolytic cell 1' and a water treatment unit 6-2 and an ion exchange unit 7-2 for positive and negative ions are provided between the used water processing cell 12-2 and the anode region of the electrolytic cell 1'. As a result, the amount of supporting electrolyte supplied to the anode side can be reduced by ⅓ to ⅕ as compared with the prior art, and the amount of supporting electrolyte supplied to the cathode side can be reduced by ½ to ⅒ as compared with the prior art.

Note that, in FIG. 20, inactive gas such as nitrogen is introduced into the used water processing cells 12-1 and 12-2, thus effectively reactivating the used water.

Figure 21:
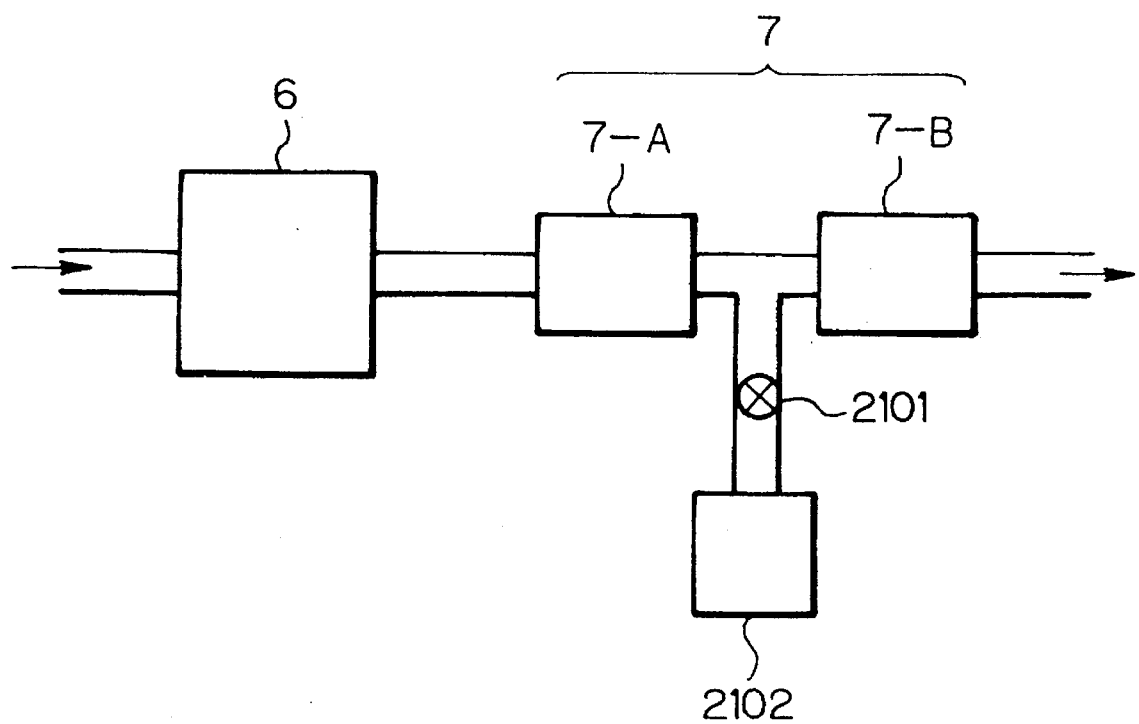
FIG. 21 is a diagram illustrating a modification of the feedback path of FIG. 3.

Also, the used water is monitored by a monitoring system as illustrated in FIG. 21. In FIG. 21, used water is filtered by the water treatment unit 6 and passes through the ion exchange unit 7 formed by two units 7-A and 7-B. In this case, some of the water is supplied via a valve 2101 to an analysis unit 2102 such as an induction coupled plasma spectral analysis unit which can carry out a ppb level analysis. When the concentration of metal included in the used water is detected by the analysis unit 2102, the ion exchange units 7 (7-A and 7-B) can be effectively operated.

As explained hereinbefore, according to the present invention, since one reactivating feedback path is provided for each of the anode water and the cathode water, the amount of chemicals can be reduced. Also, since one storing cell is provided for each of the anode active water and the cathode active water, the electrolyte cell is reduced in size, and the deterioration of electrolyte can be suppressed by each of the storing cells.

Also, since a redox sensor is provided within each of the storing cells, the deterioration of electrolyte can be completely monitored.

We claim:

1. A wet processing apparatus comprising:
   an electrolytic cell having an anode electrode and a cathode electrode for performing electrolysis upon one of pure water and electrolyte to generate anode active water in the vicinity of said anode electrode and cathode active water in the vicinity of said cathode electrode;
   a first storing cell for storing said anode active water;
   a first processing cell for receiving said anode active water from said first storing cell to process a first target with said anode active water to exhaust first water therefrom;
   a first reactivating feed back means for reactivating said first water and feeding reactivated first water back to the vicinity of said anode electrode of said electrolytic cell;
   a second storing cell for storing said cathode active water;
   a second processing cell for receiving said cathode active water from said second storing cell to process a second target with said cathode active water to exhaust second water therefrom; and
   a second reactivating feedback means for reactivating said second water and feeding reactivated second water back to the vicinity of said cathode electrode of said electrolytic cell.

2. The apparatus as set forth in claim 1, wherein said electrolytic cell comprises:
   a cell divided into first and second chambers encasing said anode electrode and said cathode electrode, respectively; and
   first and second pressure applying means for applying pressure by using inactive gas to said first and second chambers.

3. The apparatus as set forth in claim 1, wherein each of said first and second storing cells is made of fluoro-plastic.

4. The apparatus as set forth in claim 1, wherein each of said first and second storing cells is made of crystal quartz coated by metal.

5. The apparatus as set forth in claim 1, wherein each of said first and second storing cells comprises a cooling coil for cooling a respective one of said anode active water and said cathode active water.

6. The apparatus as set forth in claim 1, wherein each of said first and second storing cells comprises a member for circulating coolant therethrough.

7. The apparatus as set forth in claim 1, wherein each of said first and second storing cells is made of light shield material.

8. The apparatus as set forth in claim 1, wherein each of said first and second storing cells is made of heat-insulating material.

9. The apparatus as set forth in claim 1, wherein each of said first and second storing cells comprises a window for passing electromagnetic waves therethrough.

10. The apparatus as set forth in claim 1, wherein each of said first and second storing cells comprises a closed top container.

11. The apparatus as set forth in claim 10, wherein said closed top container has gas introducing means for introducing inactive gas thereinto.

12. The apparatus as set forth in claim 1, wherein each of said first and second storing cells comprises a level sensor for detecting a level of a respective one of said anode active water and said cathode active water.

13. The apparatus as set forth in claim 1, wherein each of said first and second storing cells comprises a PH sensor for detecting a PH of a respective one of said anode active water and said cathode active water.

14. The apparatus as set forth in claim 1, wherein each of said first and second storing cells comprises a redox potential sensor for detecting a redox potential of a respective one of said anode active water and said cathode active water.

15. The apparatus as set forth in claim 1, wherein each of said first and second storing cells comprises a particle sensor for detecting particles of a respective one of said anode active water and said cathode active water.

16. The apparatus as set forth in claim 1, wherein each of said first and second storing cells comprises a temperature sensor for detecting a temperature of a respective one of said anode active water and said cathode active water.

17. The apparatus as set forth in claim 1, further comprising:
   filter means for filtering said anode active water and said cathode active water of said first and second processing cells;
   feedback means for feeding said anode active water and said cathode active water filtered by said filter means back to said first and second processing cells, respectively.

18. The apparatus as set forth in claim 17, further comprising:
   temperature detecting means for detecting temperatures of said anode active water and said cathode active water within said first and second processing cells; and control means for controlling temperatures of said anode active water and said cathode active water within said feedback means in accordance with detected temperatures thereof.

19. The apparatus as set forth in claim 1, further comprising means for supplying an admixture to said first and second processing cells.

20. The apparatus as set forth in claim 1, wherein each of said first and second processing cells comprises a closed top container.

21. The apparatus as set forth in claim 20, wherein said closed top container has gas introducing means for introducing inactive gas thereinto.

22. The apparatus as set forth in claim 1, further comprising ultrasonic vibration applying means for applying vibration to said first and second processing cells.

23. The apparatus as set forth in claim 1, further comprising heater means for heating said first and second processing cells.

24. The apparatus as set forth in claim 23, wherein said heater means comprises lamp means.

25. The apparatus as set forth in claim 1, further comprising:

first valve means, coupled to a respective one of said first and second processing cells, for supplying electrolyte thereto;

second valve means, coupled to a respective one of said first and second processing cells, for supplying pure water thereto;

third valve means, coupled to a respective one of said first and second processing cells, for exhausting one of said electrolyte and said pure water; and controlling means for opening said second and third valve means and closing said first valve means, thus cleaning a respective one of said first and second processing cells.

26. A wet processing apparatus comprising:

an electrolytic cell having an anode electrode and a cathode electrode for performing electrolysis upon one of pure water and electrolyte to generate anode active water in the vicinity of said anode electrode and cathode active water in the vicinity of said cathode electrode;

a storing cell for storing said anode active water;

a processing cell for receiving said anode active water from said storing cell to process a target with said anode active water to exhaust water therefrom; and a reactivating feedback means for reactivating said water and feeding reactivated water back to the vicinity of said anode electrode of said electrolytic cell.

27. The apparatus as set forth in claim 26, wherein said electrolytic cell comprises:

a cell divided into first and second chambers encasing said anode electrode and said cathode electrode, respectively; and first and second pressure applying means for applying pressure by using inactive gas to said first and second chambers.

28. The apparatus as set forth in claim 26, wherein said storing cell is made of fluorine plastic.

29. The apparatus as set forth in claim 26, further comprising ultrasonic vibration applying means for applying vibration to said processing cell.

30. The apparatus as set forth in claim 26, wherein said storing cell is made of crystal quartz coated by metal.

31. The apparatus as set forth in claim 26, wherein said storing cell comprises a cooling coil for cooling said anode active water.

32. The apparatus as set forth in claim 26, wherein said storing cell comprises a member for circulating coolant therethrough.

33. The apparatus as set forth in claim 26, wherein said storing cell is made of light shield material.

34. The apparatus as set forth in claim 26, wherein said storing cell is made of heat-insulating material.

35. The apparatus as set forth in claim 26, wherein said storing cell comprises a window for passing electromagnetic waves therethrough.

36. The apparatus as set forth in claim 26, wherein said storing cell comprises a closed top container.

37. The apparatus as set forth in claim 35, wherein said closed top container has gas introducing means for introducing inactive gas thereinto.

38. The apparatus as set forth in claim 26, wherein said storing cell comprises a level sensor for detecting a level of said anode active water.

39. The apparatus as set forth in claim 26, wherein said storing cell comprises a PH sensor for detecting a PH of said anode active water.

40. The apparatus as set forth in claim 26, wherein said storing cell comprises a redox potential sensor for detecting a redox potential of said anode active water.

41. The apparatus as set forth in claim 26, wherein said storing cell comprises a particle sensor for detecting particles of said anode active water.

42. The apparatus as set forth in claim 26, wherein said storing cell comprises a temperature sensor for detecting a temperature of said anode active water.

43. The apparatus as set forth in claim 26, further comprising:

filter means for filtering said anode active water of said processing cell;

feedback means for feeding said anode active water filtered by said filter means back to said processing cell.

44. The apparatus as set forth in claim 42, further comprising:

temperature detecting means for detecting temperatures of said anode active water within said processing cell; and control means for controlling a temperature of said anode active water within said feedback means in accordance with a detected temperature thereof.

45. The apparatus as set forth in claim 26, further comprising means for supplying an admixture to said processing cell.

46. The apparatus as set forth in claim 26, wherein said processing cell comprises a closed top container.

47. The apparatus as set forth in claim 45, wherein said closed top container has gas introducing means for introducing inactive gas thereinto.

48. The apparatus as set forth in claim 26, further comprising heater means for heating said processing cell.

49. The apparatus as set forth in claim 48, wherein said heater means comprises lamp means.

50. The apparatus as set forth in claim 26, further comprising:

first valve means, coupled to said processing cell, for supplying electrolyte thereto;

second valve means, coupled to of said processing cell, for supplying pure water thereto;

third valve means, coupled to said processing cell, for exhausting one of said electrolyte and said pure water; and controlling means for opening said second and third valve means and closing said first valve means, thus cleaning said processing cell.

51. A wet processing apparatus comprising:

an electrolytic cell having an anode electrode and a cathode electrode for performing electrolysis upon one of pure water and electrolyte to generate anode active water in the vicinity of said anode electrode and cathode active water in the vicinity of said cathode electrode;

a storing cell for storing said cathode active water;

a processing cell for receiving said cathode active water from said storing cell to process a target with said cathode active water to exhaust water therefrom; and a reactivating feedback means for reactivating said water and feeding reactivated water back to the vicinity of said cathode electrode of said electrolytic cell.

52. The apparatus as set forth in claim 51, wherein said electrolytic cell comprises:

a cell divided into first and second chambers encasing said anode electrode and said cathode electrode, respectively; and first and second pressure applying means for applying pressure by using inactive gas to said first and second chambers.

53. The apparatus as set forth in claim 51, wherein said storing cell is made of fluorine plastic.

54. The apparatus as set forth in claim 51, wherein said storing cell is made of crystal quartz coated by metal.

55. The apparatus as set forth in claim 51, wherein said storing cell comprises a cooling coil for cooling said cathode active water.

56. The apparatus as set forth in claim 51, wherein said storing cell comprises a member for circulating coolant therethrough.

57. The apparatus as set forth in claim 51, wherein said storing cell is made of light shield material.

58. The apparatus as set forth in claim 51, wherein said storing cell is made of heat-insulating material.

59. The apparatus as set forth in claim 51, wherein said storing cell comprises a window for passing electromagnetic waves therethrough.

60. The apparatus as set forth in claim 51, wherein said storing cell comprises a closed top container.

61. The apparatus as set forth in claim 60, wherein said closed top container has gas introducing means for introducing inactive gas thereinto.

62. The apparatus as set forth in claim 51, wherein said storing cell comprises a level sensor for detecting a level of said cathode active water.

63. The apparatus as set forth in claim 51, wherein said storing cell comprises a PH sensor for detecting a PH of said cathode active water.

64. The apparatus as set forth in claim 51, wherein said storing cell comprises a redox potential sensor for detecting a redox potential of said cathode active water.

65. The apparatus as set forth in claim 51, wherein said storing cell comprises a particle sensor for detecting particles of said cathode active water.

66. The apparatus as set forth in claim 51, wherein said storing cell comprises a temperature sensor for detecting a temperature of said cathode active water.

67. The apparatus as set forth in claim 51, further comprising:

filter means for filtering said cathode active water of said processing cell;

feedback means for feeding said cathode active water filtered by said filter means back to said processing cell.

68. The apparatus as set forth in claim 67, further comprising:

temperature detecting means for detecting temperatures of said cathode active water within said processing cell; and control means for controlling a temperature of said cathode active water within said feedback means in accordance with a detected temperature thereof.

69. The apparatus as set forth in claim 51, further comprising means for supplying an admixture to said processing cell.

70. The apparatus as set forth in claim 51, wherein said processing cell comprises a closed top container.

71. The apparatus as set forth in claim 70, wherein said closed top container has gas introducing means for introducing inactive gas thereinto.

72. The apparatus as set forth in claim 51, further comprising ultrasonic vibration applying means for applying vibration to said processing cell.

73. The apparatus as set forth in claim 51, further comprising heater means for heating said processing cell.

74. The apparatus as set forth in claim 73, wherein said heater means comprises lamp means.

75. The apparatus as set forth in claim 51, further comprising:

first valve means, coupled to said processing cell, for supplying electrolyte thereto;

second valve means, coupled to of said processing cell, for supplying pure water thereto;

third valve means, coupled to said processing cell, for exhausting one of said electrolyte and said pure water; and controlling means for opening said second and third valve means and closing said first valve means, thus cleaning said processing cell.

76. A wet processing apparatus comprising:

an electrolytic cell having an anode electrode and a cathode electrode for performing electrolysis upon one of pure water and electrolyte to generate anode active water in the vicinity of said anode electrode and cathode active water in the vicinity of said cathode electrode;

a first storing cell for storing said anode active water;

a first processing cell for receiving said anode active water from said first storing cell to process a first target with said anode active water to exhaust first water therefrom;

a first reactivating feedback means for reactivating said first water and feeding reactivated first water back to the vicinity of said anode electrode of said electrolytic cell;

a first electrolyte supplying means for supplying first electrolyte to said first water;

a second storing cell for storing said cathode active water;

a second processing cell for receiving said cathode active water from said second storing cell to process a second target with said cathode active water to exhaust second water therefrom;

a second reactivating feedback means for reactivating said second water and feeding reactivated second water back to the vicinity of said cathode electrode of said electrolytic cell; and a second electrolyte supplying means for supplying second electrolyte to said second water.

77. A wet processing apparatus comprising:

an electrolytic cell having an anode electrode and a cathode electrode for performing electrolysis upon one of pure water and electrolyte to generate anode active water in the vicinity of said anode electrode and cathode active water in the vicinity of said cathode electrode;

a storing cell for storing said anode active water;

a processing cell for receiving said anode active water from said storing cell to process a target with said anode active water to exhaust water therefrom; and a reactivating feedback means for reactivating said water and feeding reactivated water back to the vicinity of said anode electrode of said electrolytic cell; and an electrolyte supplying means for supplying electrolyte to said anode water.

78. A wet processing apparatus comprising:

an electrolytic cell having an anode electrode and a cathode electrode for performing electrolysis upon one of pure water and electrolyte to generate anode active water in the vicinity of said anode electrode and cathode active water in the vicinity of said cathode electrode;

a storing cell for storing said cathode active water;

a processing cell for receiving said cathode active water from said storing cell to process a target with said cathode active water to exhaust water therefrom;

a reactivating feedback means for reactivating said water and feeding reactivated water back to the vicinity of said cathode electrode of said electrolytic cell; and an electrolyte supplying means for electrolyte to said cathode water.

\* \* \* \* \*